(12) United States Patent
Hoshi

(10) Patent No.: US 11,276,621 B2
(45) Date of Patent: Mar. 15, 2022

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/107,628

(22) Filed: Nov. 30, 2020

(65) Prior Publication Data
US 2021/0217678 A1    Jul. 15, 2021

(30) Foreign Application Priority Data
Jan. 9, 2020    (JP) .............................. JP2020-002468

(51) Int. Cl.
| | |
|---|---|
| *H01L 29/78* | (2006.01) |
| *H01L 23/34* | (2006.01) |
| *H01L 29/16* | (2006.01) |
| *H01L 29/66* | (2006.01) |

(52) U.S. Cl.
CPC .......... *H01L 23/34* (2013.01); *H01L 29/1608* (2013.01); *H01L 29/66068* (2013.01); *H01L 29/7813* (2013.01); *H01L 29/7815* (2013.01)

(58) Field of Classification Search
CPC ... H01L 21/0465; H01L 21/049; H01L 23/34; H01L 29/1608; H01L 29/66068; H01L 29/7813; H01L 29/7815; H01L 27/0629; H01L 29/0696; H01L 29/7801–7826
See application file for complete search history.

(56) References Cited

U.S. PATENT DOCUMENTS

2014/0362490 A1    12/2014  Maekawa et al.
2018/0277437 A1*   9/2018   Yamada .............. H01L 29/1608

FOREIGN PATENT DOCUMENTS

| | | |
|---|---|---|
| JP | 2013-073969 A | 4/2013 |
| JP | 2014-241672 A | 12/2014 |

\* cited by examiner

*Primary Examiner* — Eric A. Ward
(74) *Attorney, Agent, or Firm* — Rabin & Berdo, P.C.

(57) ABSTRACT

A semiconductor device, comprising a first MOS structure region, a second MOS structure region, a first temperature sensing region, and a second temperature sensing region. The first temperature sensing region is provided in a region through which a main current of the semiconductor device passes when the first MOS structure region is in an ON state. The second temperature sensing region is provided in a region through which the main current of semiconductor device passes when the second MOS structure region is in the ON state.

12 Claims, 17 Drawing Sheets

FIG.12
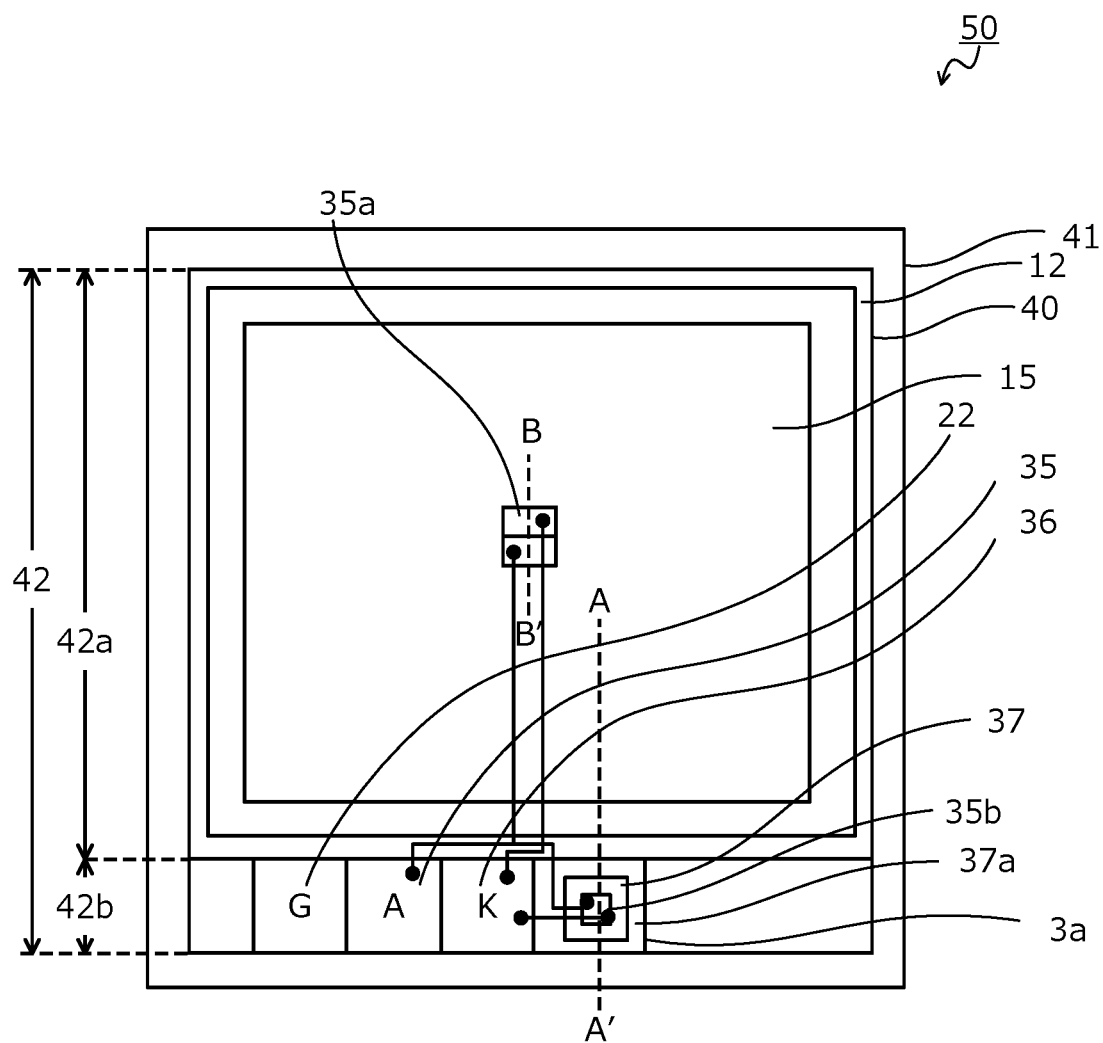
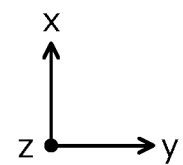

SEMICONDUCTOR DEVICE

CROSS REFERENCE TO RELATED APPLICATIONS

This application is based upon and claims the benefit of priority of the prior Japanese Patent Application No. 2020-002468, filed on Jan. 9, 2020, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon, such as, for example, gallium nitride (GaN). Therefore, use of a wide bandgap semiconductor enables high withstand voltage for semiconductor devices.

FIG. 18 is a top view of a structure of a conventional silicon carbide semiconductor device. As depicted in FIG. 18, on a semiconductor chip 160, at an outer periphery of an active region 140 through which a main current passes, an edge termination region 141 that sustains breakdown voltage is provided surrounding a periphery of the active region 140. In the active region 140, a gate electrode pad 122 electrically connected to gate electrodes and a source electrode pad 115 electrically connected to source electrodes are provided.

To further improve the reliability of silicon carbide semiconductor devices, a semiconductor device has been proposed in which high-function regions 103$a$ such as a current sensing region 137$a$, a temperature sensing region 135$a$, and an over-voltage protecting region (not depicted) are disposed on a single semiconductor substrate having a vertical MOSFET that is a main semiconductor element. In an instance of a high-function structure, to stably form high-function regions, a region in which only the high-function regions 103$a$ are disposed is provided in the active region 140, separate from unit cells of the main semiconductor element and adjacent to the edge termination region 141. The active region 140 is a region through which the main current passes when the main semiconductor element is in an ON state. The edge termination region 141 is a region for mitigating electric field on a front side of the semiconductor substrate and for sustaining the breakdown voltage (withstand voltage). The breakdown voltage is a voltage limit at which no erroneous operation or destruction of an element occurs.

In the current sensing region 137$a$ having a structure similar to that of the active region 140, an active region and an external terminal electrode of the current sensing region 137$a$ are provided, the external terminal electrode being for detecting current. In current detection, external resistors are connected between an OC pad 137 that is an electrode pad of the current sensing region 137$a$ and the source electrodes of the active region 140, and a difference in potential between the external resistors is detected to obtain a current value.

The temperature sensing region 135$a$ has a function of detecting the temperature of the semiconductor chip 160, using diode temperature characteristics. The temperature sensing region 135$a$ is disposed at a center of the semiconductor chip 160 and is connected to an anode electrode pad 135 and a cathode electrode pad 136.

FIG. 19 is a cross-sectional view of the structure of the conventional silicon carbide semiconductor device along cutting line A-A' in FIG. 18. FIG. 20 is an equivalent circuit diagram of the current sensing region and the temperature sensing region of the conventional silicon carbide semiconductor device. A trench-type MOSFET 150 is depicted as the conventional silicon carbide semiconductor device. In the trench-type MOSFET 150, an n-type silicon carbide epitaxial layer 102 is deposited on a front surface of an n$^+$-type silicon carbide substrate 101. In the n-type silicon carbide epitaxial layer 102, at a first surface thereof opposite a second surface thereof facing the n$^+$-type silicon carbide substrate 101, n-type high-concentration regions 106 are provided. Further, in the n-type high-concentration regions 106, second p$^+$-type base regions 105 are selectively provided respectively underlying entire areas of bottoms of trenches 118. In a surface layer of each of the n-type high-concentration regions 106 on a first side thereof opposite a second side thereof facing the n$^+$-type silicon carbide substrate 101, first p$^+$-type base regions 104 are selectively provided.

In the conventional trench-type MOSFET 150, a p-type base layer 103, n$^+$-type source regions 107, p$^{++}$-type contact regions 108, gate insulating films 109, gate electrodes 110, an interlayer insulating film 111, source electrodes 113, a back electrode 114, the source electrode pad 115, and a drain electrode pad (not depicted) are further provided.

The source electrode pad 115, for example, includes a first TiN film 125, a first Ti film 126, a second TiN film 127, a second Ti film 128, and an Al alloy film 129 stacked therein. Further, on a top of the source electrode pad 115, plating films 116, a solder 117, external terminal electrodes 119, first protective films 121, and second protective films 123 are provided.

Further, in the temperature sensing region 135a, the field insulating film 180 is provided on the surface of the $p^{++}$-type contact region 108, and a diode configured by a p-type polysilicon layer 181 and an n-type polysilicon layer 182 formed by a polysilicon (poly-Si) layer on a surface of a field insulating film 180 is provided. The p-type polysilicon layer 181 and the n-type polysilicon layer 182 are connected to an anode electrode 184 and a cathode electrode 185, respectively. The anode electrode 184 and the cathode electrode 185 are insulated from one another by the interlayer insulating film 111 and are connected to the anode electrode pad 135 and the cathode electrode pad 136, respectively. On a top of the anode electrode pad 135 and on a top of the cathode electrode pad 136, the plating films 116, the solder 117, the external terminal electrodes 119, the first protective films 121, and the second protective films 123 are provided.

Further, a semiconductor device having a structure that more assuredly detects abnormal heat generated by the semiconductor device by temperature detecting diodes that are each connected in parallel between a pair of signal pads is commonly known (for example, refer to Japanese Laid-Open Patent Publication No. 2013-073969).

Further, a semiconductor device that passes a first detection current and a second detection current branched from an operating current on an emitter terminal side to a first sensing element and a second sensing element, respectively and detects the voltage occurring at both of these ends at this time as output voltage for each to thereby accurately monitor the temperature and suitably perform operation to protect against over-heating is commonly known (for example, refer to Japanese Laid-Open Patent Publication No. 2014-241672).

SUMMARY OF THE INVENTION

According to an embodiment of the invention, a semiconductor device, has a first metal oxide semiconductor (MOS) structure region, a second MOS structure region, a first temperature sensing region through which a main current of the semiconductor device passes when the first MOS structure region is in an ON state, and a second temperature sensing region through which the main current passes when the second MOS structure region is in the ON state. The semiconductor device includes: a semiconductor substrate of a first conductivity type, having a front surface and a back surface; a first semiconductor layer of the first conductivity type, provided on the front surface of the semiconductor substrate, the first semiconductor layer having an impurity concentration lower than an impurity concentration of the semiconductor substrate, and having a first surface and a second surface that are opposite to each other, the second surface thereof facing the semiconductor substrate; in the first MOS structure region: a first second-semiconductor-layer of a second conductivity type, provided on the first surface of the first semiconductor layer and having a first surface and a second surface that are opposite to each other, the second surface thereof facing the semiconductor substrate, a plurality of first first-semiconductor regions of the first conductivity type, selectively provided in the first second-semiconductor-layer at the first surface thereof, each first first-semiconductor region having a first surface and a second surface that are opposite to each other, the second surface thereof facing the semiconductor substrate, a plurality of first gate insulating films each having a first surface and a second surface that are opposite to each other, the second surface thereof being in contact with the first second-semiconductor-layer, a plurality of first gate electrodes provided on the first surfaces of the first gate insulating films, respectively, and a plurality of first first-electrodes provided on the first surface of the first second-semiconductor-layer and the first surfaces of the first first-semiconductor regions; in the second MOS structure region: a second second-semiconductor-layer of the second conductivity type, provided on the first surface of the first semiconductor layer and having a first surface and a second surface that are opposite to each other, the second surface thereof facing the semiconductor substrate, a plurality of second first-semiconductor-regions of the first conductivity type, selectively provided in the second second-semiconductor-layer at the first surface thereof, each second first-semiconductor-region having a first surface and a second surface that are opposite to each other, the second surface thereof facing the semiconductor substrate; a plurality of second gate insulating films each having a first surface and a second surface, the second surface thereof being in contact with the second second-semiconductor-layer; a plurality of second gate electrodes provided on the first surfaces of the second gate insulating films, respectively, and a plurality of second first-electrodes provided on the first surface of the second second-semiconductor-layer and the first surfaces of the second first-semiconductor-regions; in the first temperature sensing region: the first second-semiconductor-layer, a first first-polysilicon-layer of the first conductivity type and a first second-polysilicon-layer of the second conductivity type formed on the first second-semiconductor-layer or in the first semiconductor layer, a first cathode electrode electrically connected to the first first-polysilicon-layer, and a first anode electrode electrically connected to the first second-polysilicon-layer; in the second temperature sensing region: the second second-semiconductor-layer, a second first-polysilicon-layer of the first conductivity type and a second second-polysilicon-layer of the second conductivity type formed on the second second-semiconductor-layer or in the first semiconductor layer, a second cathode electrode electrically connected to the second first-polysilicon-layer, and a second anode electrode electrically connected to the second second-polysilicon-layer; and a second electrode provided on the back surface of the semiconductor substrate.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 12 is a top view of a structure of a silicon carbide semiconductor device according to a second embodiment.

DETAILED DESCRIPTION OF THE INVENTION

Figure 1:
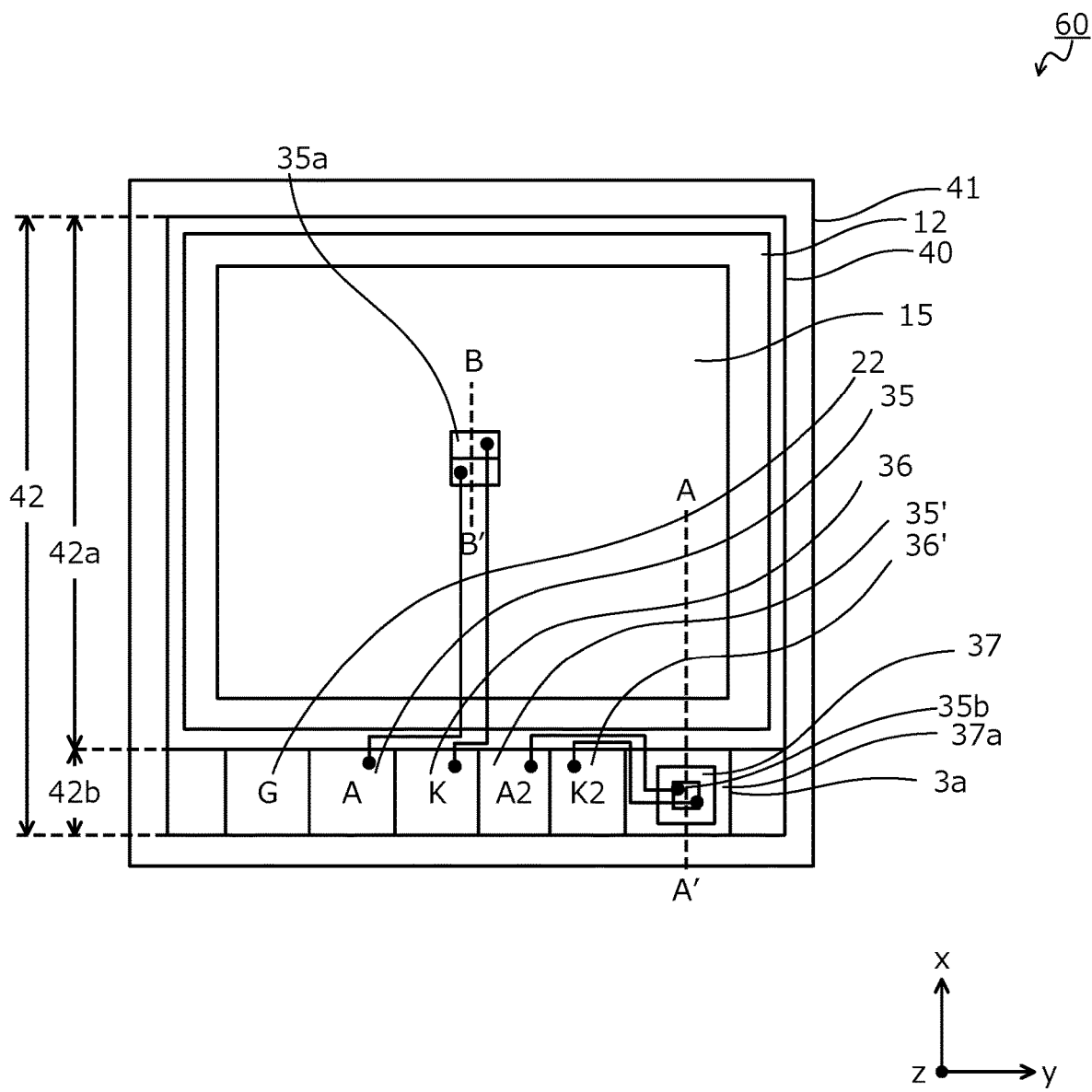
FIG. 1 is a top view of a structure of a silicon carbide semiconductor device according to a first embodiment.

First, problems associated with the conventional techniques will be discussed. The current sensing region 137a has a similar structure to and operates under similar conditions as the main semiconductor element provided beneath the source electrode pad 115, and the current sensing region 137a has a function of detecting overcurrent (OC) flowing in the main semiconductor element. However, the vertical MOSFET 150 having the conventional structure is used under high frequencies (for example, at least 100 kHz) and large currents and therefore, the current flowing in the current sensing region 137a increases, transient temperature increases are quick, and the temperature rise of the element is not uniform. This is similarly true for the current sensing region 137a having a structure similar to that of the main semiconductor element and in some instances, the temperature of the current sensing region 137a increases and the current sensing region 137a cannot operate properly. In this instance, a problem arises in that the current sensing region 137a cannot detect overcurrent, whereby reliability of the semiconductor device decreases.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to the invention is configured using a wide bandgap semiconductor. In a first embodiment, a silicon carbide semiconductor device fabricated using, for example, silicon carbide (SiC) as a wide bandgap semiconductor will be described taking a MOSFET as an example.

Figure 2:
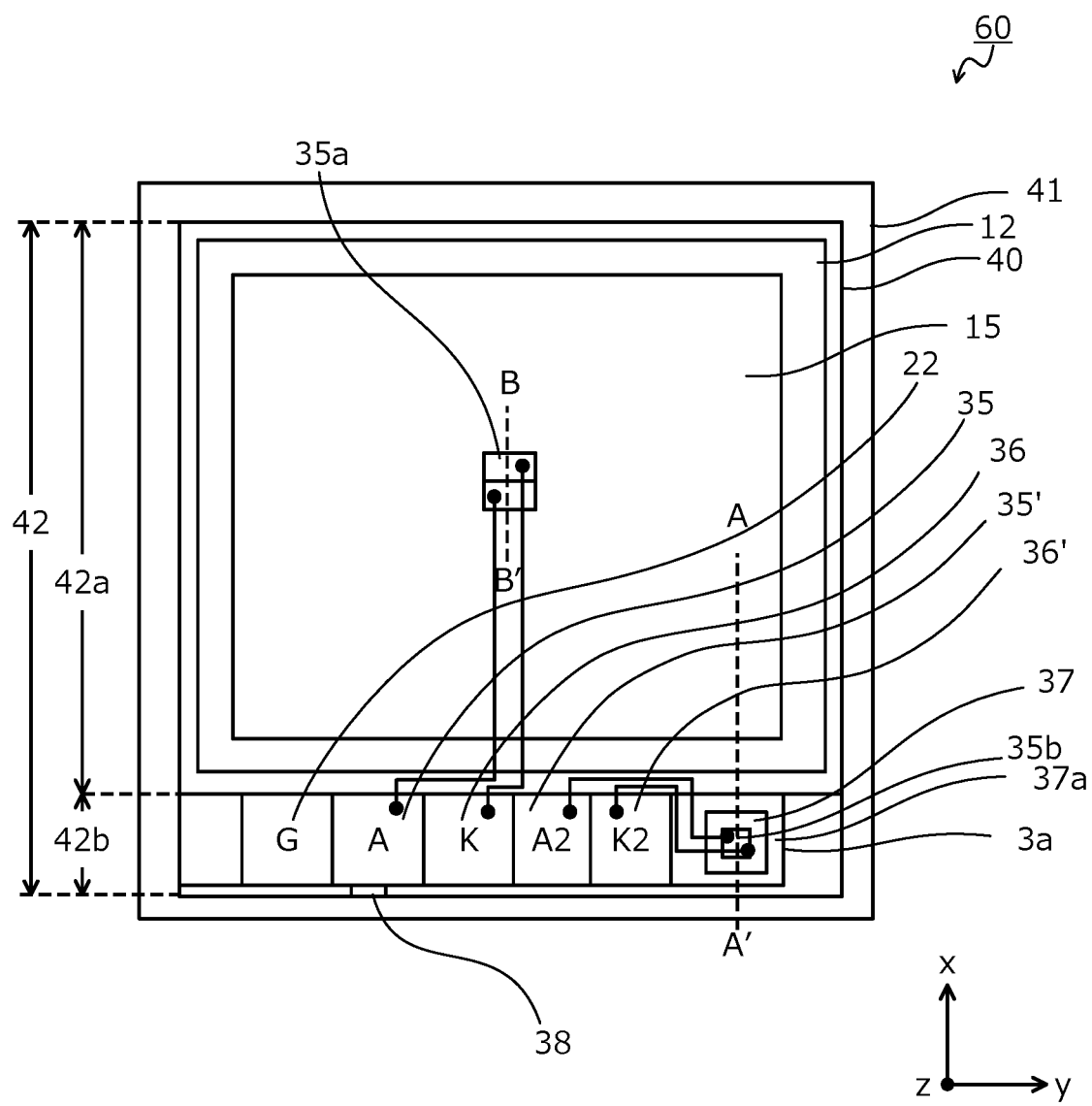
FIG. 2 is a top view of another structure of the silicon carbide semiconductor device according to the first embodiment.
Figure 3:
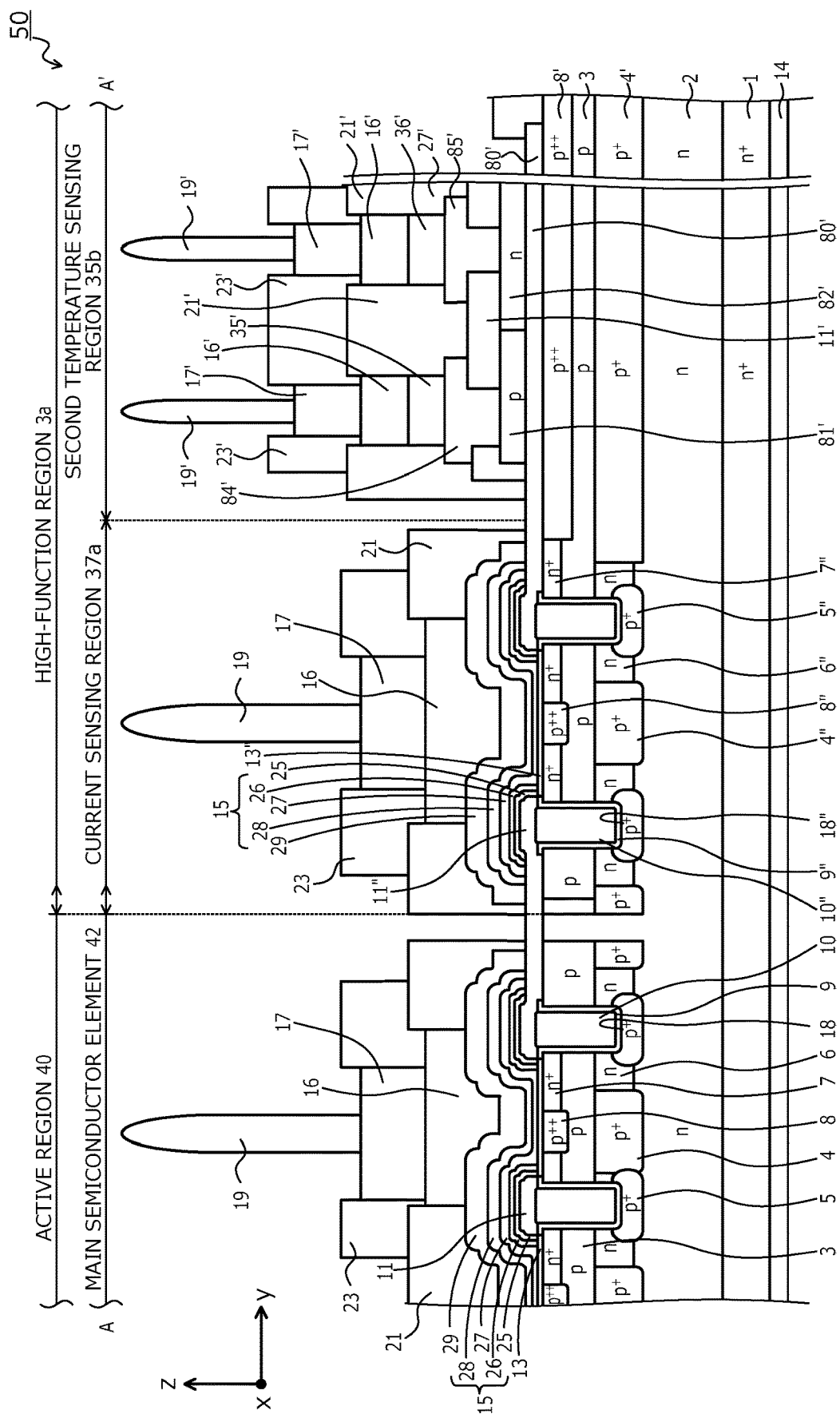
FIG. 3 is a cross-sectional view of the structure of the silicon carbide semiconductor device according to the first embodiment along cutting line A-A' in FIG. 1.
Figure 4:
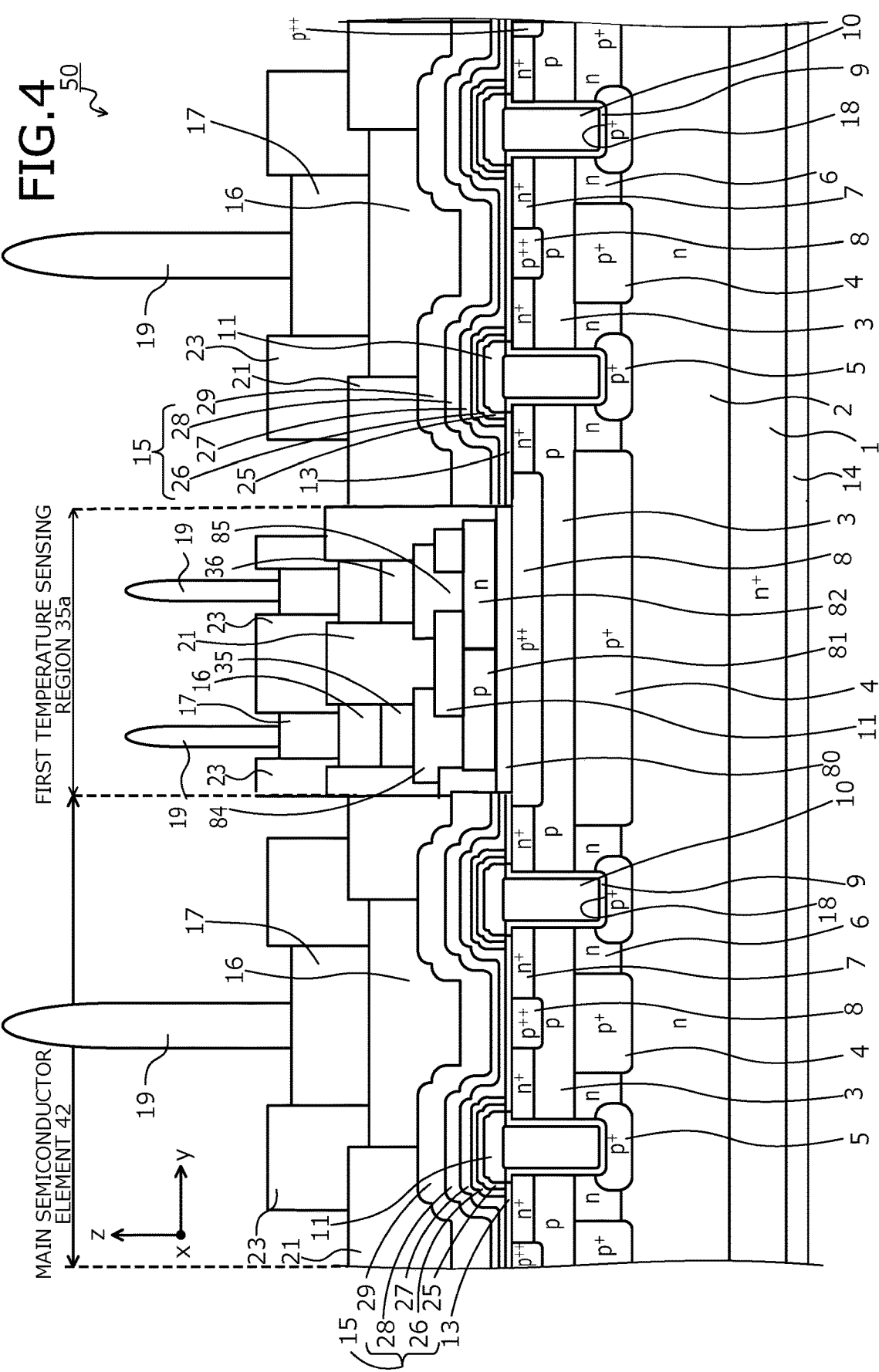
FIG. 4 is a cross-sectional view of the structure of the silicon carbide semiconductor device according to the first embodiment along cutting line B-B' in FIG. 1.
Figure 5:
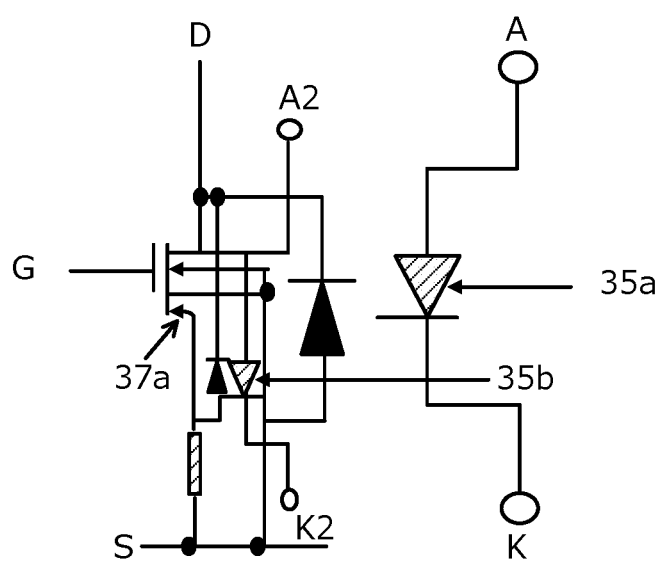
FIG. 5 is an equivalent circuit diagram of a current sensing region and a temperature sensing region of the silicon carbide semiconductor device according to the first embodiment.

FIG. 1 is a top view of a structure of the silicon carbide semiconductor device according to a first embodiment. FIG. 2 is a top view of another structure of the silicon carbide semiconductor device according to the first embodiment. FIG. 3 is a cross-sectional view of the structure of the silicon carbide semiconductor device according to the first embodiment along cutting line A-A' in FIG. 1. FIG. 4 is a cross-sectional view of the structure of the silicon carbide semiconductor device according to the first embodiment along cutting line B-B' in FIG. 1. FIG. 5 is an equivalent circuit diagram of a current sensing region and a temperature sensing region of the silicon carbide semiconductor device according to the first embodiment. As depicted in FIGS. 1 and 2, a semiconductor chip 60 includes at an outer periphery of an active region 40 through which a main current passes, an edge termination region 41 that surrounds a periphery of the active region 40 and sustains a breakdown voltage.

The semiconductor chip 60 according to the first embodiment depicted in FIGS. 1 and 2 includes a main semiconductor element 42 provided in the active region 40 of a semiconductor substrate (semiconductor chip). The main semiconductor element 42 is a vertical MOSFET 50 in which, when in an ON state, drift current passes in a depth direction. The main semiconductor element 42 is configured by multiple unit cells (functional units of an element) connected to one another in parallel by a source electrode pad 15.

The unit cells of the main semiconductor element 42 are disposed adjacent to one another along a direction parallel to a front surface of the semiconductor chip 60. The main semiconductor element 42 performs a main function of the vertical MOSFET 50 according to the first embodiment. The main semiconductor element 42 is disposed in an effective region (main effective region) of the active region 40. This main effective region 42a is a region through which the main current of the main semiconductor element 42 passes when the main semiconductor element 42 is in an ON state. The main effective region 42a has, for example, a substantially rectangular planar shape and occupies a majority of the surface area of the active region 40.

A circuit region for protecting and controlling the main semiconductor element 42, for example, is a high-functioning region such as a current sensing region 37a, first and second temperature sensing regions 35a, 35b, an over-voltage protecting region (not depicted), and arithmetic circuit region (not depicted), high-functioning regions other than the first temperature sensing region 35a are disposed in a main non-operating region 42b (high-function region 3a) of the active region 40. The first temperature sensing region 35a is disposed in the main effective region 42a. The main non-operating region 42b is a region free of unit cells of the main semiconductor element 42 and does not function as the main semiconductor element 42. The main non-operating region 42b, for example, has a substantially rectangular planar shape and is disposed between the main effective region 42a and the edge termination region 41.

The edge termination region 41 is a region between the active region 40 and ends of the semiconductor chip 60, surrounding a periphery of the active region 40; the edge termination region 41 mitigates electric field in a front (upper) portion of the semiconductor chip 60 and sustains the breakdown voltage. In the edge termination region 41, for example, a voltage withstanding structure (not depicted) such as a field limiting ring (FLR), a junction termination extension (JTE) structure, etc. is disposed. The breakdown voltage is a voltage limit at which no erroneous operation or destruction of an element occurs.

The source electrode pad 15 of the main semiconductor element 42 is disposed on the front surface of the semiconductor chip 60 in the main effective region 42a. The main semiconductor element 42 has a large current capability as compared to the other circuit regions. Therefore, the source electrode pad 15 of the main semiconductor element 42 has a planar shape that is substantially identical to that of the main effective region 42a and covers substantially an entire area of the main effective region 42a. The source electrode pad 15 of the main semiconductor element 42 is disposed to be separate from other electrode pads excluding the source electrode pad 15.

The other electrode pads excluding the source electrode pad 15 are disposed to be separate from the edge termination region 41 and are disposed on the front surface of the semiconductor chip 60 in the main non-operating region 42b, separate from one another. The other electrode pads excluding the source electrode pad 15 include a gate electrode pad 22 of the main semiconductor element 42, an electrode pad (hereinafter, OC pad) 37 of the current sensing region 37a, electrode pads (hereinafter, first and second anode electrode pads 35, 35' and first and second cathode electrode pads 36, 36') of the first and the second temperature sensing regions 35a, 35b, an electrode pad (hereinafter, OV pad, not depicted) of the over-voltage protecting region, and an electrode pad (not depicted) of the arithmetic circuit region, etc.

Each of the other electrode pads excluding the source electrode pad 15, for example, has a substantially rectangular planar shape and a surface area necessary for bonding wires, external terminal electrodes 19, etc. described hereinafter. FIGS. 1 and 2 depict an instance in which the other electrode pads excluding the source electrode pad 15 are disposed in a single row along a border between the main non-operating region 42b and the edge termination region 41. Further, in FIGS. 1 and 2, the gate electrode pad 22, the first anode electrode pad 35, the first cathode electrode pad 36, the second anode electrode pad 35', and the second cathode electrode pad 36' are depicted, respectively, as rectangles indicated by G, A, K, A2, and K2, respectively.

The current sensing region 37a operates under conditions similar to those of the vertical MOSFET 50 that is the main semiconductor element 42 and has a function of detecting overcurrent (OC) flowing in the vertical MOSFET 50 that is the main semiconductor element 42. The current sensing region 37a is disposed separate from the vertical MOSFET 50 that is the main semiconductor element 42. The current sensing region 37a is a vertical MOSFET having unit cells of a configuration similar to the configuration of those of the main semiconductor element 42, the current sensing region 37a having a fewer number of unit cells (for example, about 10) than does the main semiconductor element 42 (for example, about 10,000) and a smaller surface area than does the main semiconductor element 42.

Unit cells of the current sensing region 37a are disposed in a region (hereinafter, sensing effective region) directly beneath the OC pad 37. The sensing effective region, for example, has a substantially rectangular planar shape. Unit cells of the current sensing region 37a are disposed adjacent to one another along a direction parallel to the front surface of the semiconductor chip 60. The direction along which the unit cells of the current sensing region 37a are adjacent to one another, for example, is a same direction as that along which the unit cells of the main semiconductor element 42 are adjacent to one another. The unit cells of the current sensing region 37a are connected to one another in parallel by the OC pad 37.

The first temperature sensing region 35a has a function of detecting the temperature of the main semiconductor element 42, using diode temperature characteristics. Therefore, the first temperature sensing region 35a is provided in the active region 40 through which the main current passes when the main semiconductor element 42 is in an ON state. Similarly, the second temperature sensing region 35b has a function of detecting the temperature of the current sensing region 37a. Therefore, the second temperature sensing region 35b is provided in the main non-operating region 42b of the active region 40 through which the main current passes when the current sensing region 37a is in an ON state.

For example, in the first and the second temperature sensing regions 35a, 35b, diodes formed by later described p-type polysilicon layers 81, 81' and n-type polysilicon layers 82, 82' are provided (refer to FIGS. 3 and 4). Forward current Vf of these diodes varies according to temperature and the higher is the temperature, the lower is the forward current Vf. Therefore, a relationship between the temperate and the forward current Vf is obtained in advance and by measuring the forward current Vf of the diodes during operation of the MOSFET 50, the temperature of the MOSFET 50 may be measured.

In semiconductor devices, when the frequency increases, the ON period becomes shorter, the rise of the current becomes steep, and current density also increases, thus, the overall operating temperature range increases. Therefore, in a functional element that sets a certain upper limit current setting value for the rated current and uses the current sensing region 37a to implement a function, current density becomes high due to high frequency and the higher is the temperature under which the functional element is used, the frequency that the current sensing region 37a is used inevitably increases. When the temperature becomes a temperature under which the current sensing region 37a cannot operate properly, the current sensing region 37a may become unable to detect overcurrent and therefore, similarly to monitoring of the temperature of the main effective region 42a, monitoring of the temperature of the current sensing region 37a is necessary.

Therefore, in the first embodiment, the second temperature sensing region 35b is provided in the current sensing region 37a. The second temperature sensing region 35b is a structure configured to detect abnormal heat generated by the current sensing region 37a. The diode of the second temperature sensing region 35b is disposed in an active region of the current sensing region 37a, implementing a function of the current sensing region 37a. As a result, in the silicon carbide semiconductor device of the first embodiment, detection of abnormal heat generated by the current sensing region 37a becomes possible. Therefore, even when the silicon carbide semiconductor device is used under large currents, high frequencies, and high temperatures, instances in which the temperature becomes that under which the current sensing region 37a cannot operate properly and overcurrent cannot be detected are prevented, thereby enabling improvement of the reliability.

Further, the second anode electrode pad 35' and the second cathode electrode pad 36' are disposed in the main non-operating region 42b, as a pads for leading out signals other than those of an anode electrode and a cathode electrode of the second temperature sensing region 35b. In this manner, electrode pads for supplying current from an external power source circuit to the diode of the first temperature sensing region 35a of the main effective region 42a and the diode of the second temperature sensing region 35b of the current sensing region 37a are provided, respectively. As a result, the temperature of abnormal heat generated by the current sensing region 37a may be monitored separately from the temperature of abnormal heat generated by the main effective region 42a and therefore, fluctuation values of characteristics may be efficiently monitored for the current sensing region 37a as a functional element, similarly to the main effective region 42a. Further, since electrode pads for supplying current from external power source circuits are provided separately, the monitoring temperature may be freely set with an applicable range of each specification. For example, when the second temperature sensing region 35b is to have a set temperature lower than that of the first temperature sensing region 35a, a peripheral portion caused by the current sensing region or an anomalous signal due to an external signal may be detected early, which is advantageous. In contrast, when the second temperature sensing region 35b is set to have a temperature higher than that of the first temperature sensing region 35a, the main element, peripheral components of the main element, and effects of an external circuit on the main element may be detected early, which is advantageous, and in particular, risk management for monitoring abnormalities in current sensing not managed until now increases, which is advantageous.

Further in the embodiment depicted in FIG. 2, an extracting region 38 is provided in the main non-operating region 42b, between the electrode pads and the edge termination region 41. Displacement current flowing into the active region 40 from the edge termination region 41 is lead out by the extracting region 38, thereby enabling concentration of the displacement current in the active region 40 to be suppressed and resistance to destruction in the edge termination region 41 to be enhanced.

The over-voltage protecting region (not depicted), for example, is a diode that protects the main semiconductor element 42 from overvoltage (OV) such as surges. The current sensing region 37a, the first temperature sensing region 35a, the second temperature sensing region 35b, and the over-voltage protecting region are controlled by the arithmetic circuit region. The main semiconductor element 42 is controlled based on signals output by the current sensing region 37a, the first temperature sensing region 35a, the second temperature sensing region 35b, and over-voltage protecting region. The arithmetic circuit region is configured by multiple semiconductor elements such as a complementary MOS (CMOS) circuit.

FIG. 3 is a cross-sectional view of the structure of the silicon carbide semiconductor device according to the first embodiment along cutting line A-A' in FIG. 1. FIG. 4 is a cross-sectional view of the structure of the silicon carbide semiconductor device according to the first embodiment along cutting line B-B' in FIG. 1. FIG. 3 depicts a cross-sectional view of the structure along cutting line A-A', which passes through the second temperature sensing region 35b, from a region (hereinafter, MOS structure region) in which the MOS structure (three-layered structure including a metal, an oxide film, and a semiconductor) of the main effective region 42a depicted in FIG. 1 is formed. Further, FIG. 4 depicts a cross-sectional view of the structure along cutting line B-B', which runs from the MOS structure region, passes through the first temperature sensing region 35a, to the MOS structure region.

As depicted in FIG. 3, in the MOSFET 50 of the silicon carbide semiconductor device according to the present embodiment, an n-type silicon carbide epitaxial layer (first semiconductor layer of a first conductivity type) 2 is deposited on a first main surface (front surface) of an $n^+$-type silicon carbide substrate (semiconductor substrate of the first conductivity type) 1, the first main surface being, for example, a (0001) plane (Si-face). The $n^+$-type silicon carbide substrate 1, for example, is a silicon carbide single crystal substrate doped with nitrogen (N). The n-type silicon carbide epitaxial layer 2 is a low-concentration n-type drift layer doped with, for example, nitrogen at an impurity concentration lower than an impurity concentration of the $n^+$-type silicon carbide substrate 1.

As depicted in FIGS. 3 and 4, a back electrode 14 is provided on a second main surface (a back surface, i.e., a back surface of a silicon carbide semiconductor base) of the $n^+$-type silicon carbide substrate 1. The back electrode 14 configures a drain electrode. On a surface of the back electrode 14, a drain electrode pad (not depicted) is provided.

As depicted in FIGS. 3 and 4, in the main semiconductor element (first MOS structure region) 42, in the n-type silicon carbide epitaxial layer 2, at a first surface thereof opposite a second surface thereof facing the $n^+$-type silicon carbide substrate 1, n-type high-concentration regions 6 may be provided. The n-type high-concentration regions 6 are a high-concentration n-type drift layer having an impurity concentration lower than the impurity concentration of the $n^+$-type silicon carbide substrate 1 and higher than the impurity concentration of the n-type silicon carbide epitaxial layer 2.

On first surfaces of the n-type high-concentration regions 6 (in an instance in which the n-type high-concentration regions 6 are not provided, the n-type silicon carbide epitaxial layer 2, hereinafter, simply "(2)"), a p-type base layer (first second-semiconductor-layer of a second conductivity type) 3 is provided, the first surfaces of the n-type high-concentration regions 6 being opposite second surfaces thereof facing the $n^+$-type silicon carbide substrate 1. Hereinafter, the $n^+$-type silicon carbide substrate 1, the n-type silicon carbide epitaxial layer 2, and the p-type base layer 3 are collectively a silicon carbide semiconductor base.

In the silicon carbide semiconductor base, at a first main surface (first surface of the p-type base layer 3) thereof, a trench structure is provided in a striped pattern. In particular, trenches (first trenches) 18 penetrate through the p-type base layer 3 from the first surface of the p-type base layer 3 (first main surface of the silicon carbide semiconductor base) opposite a second surface of the p-type base layer 3 facing the $n^+$-type silicon carbide substrate 1, and reach the n-type high-concentration regions 6(2). Along inner walls of the trenches 18, gate insulating films (first gate insulating films) 9 are formed at bottoms and sidewalls of the trenches 18, and stripe-shaped gate electrodes (first gate electrodes) 10 are formed on the gate insulating films 9 in the trenches 18. The gate electrodes 10 are insulated from the n-type high-concentration regions 6 and the p-type base layer 3 by the gate insulating films 9. A portion of each of the gate electrodes 10 protrudes from a top of the trench 18 toward the source electrode pad 15 described hereinafter.

In surface layers of the n-type high-concentration regions 6(2), at the first surfaces (first main surface of the silicon carbide semiconductor base) thereof opposite the second surfaces thereof facing the $n^+$-type silicon carbide substrate 1, first $p^+$-type base regions 4 may be selectively provided. Second $p^+$-type base regions 5 may be provided beneath the trenches 18, the width of the second $p^+$-type base regions 5 being wider than the width the trenches 18. The first $p^+$-type base regions 4 and the second $p^+$-type base regions 5, for example, are doped with aluminum.

Portions of the first $p^+$-type base regions 4 extend toward the trenches 18, whereby the second $p^+$-type base regions 5 are structured to be connected to the first $p^+$-type base regions 4. The portions of the first $p^+$-type base regions 4 may have a planar layout in which the portions are disposed to repeatedly alternate with the n-type high-concentration regions 6(2) along a direction (hereinafter, second direction) x orthogonal to a direction (hereinafter, first direction) y along which the first $p^+$-type base regions 4 and the second $p^+$-type base regions 5 are arranged. For example, connecting regions in which the portions of the first $p^+$-type base regions 4 extend toward both of the trenches 18 along the first direction y may be provided, and a structure connected to the second $p^+$-type base regions 5 may be periodically disposed along the second direction x. A reason for this is that holes generated when avalanche breakdown occurs at bonded portions of the second $p^+$-type base regions 5 and the n-type silicon carbide epitaxial layer 2 are efficiently migrated to source electrodes 13, whereby load to the gate insulating films 9 is reduced and reliability is increased. For example, the first $p^+$-type base regions 4, the connecting regions, the second $p^+$-type base regions 5, as a whole, may form a grid-like shape in a plan view.

In the p-type base layer 3, at the first main surface of the silicon carbide semiconductor base, $n^+$-type source regions (first first-semiconductor regions of the first conductivity type) 7 are selectively provided. Further, $p^{++}$-type contact regions 8 may be provided. The $n^+$-type source regions 7 are in contact with the trenches 18. Further, the $n^+$-type source regions 7 and the $p^{++}$-type contact regions 8 are in contact with one another.

Further, the n-type high-concentration regions 6(2) are provided in regions sandwiched between the first $p^+$-type base regions 4 and the second $p^+$-type base regions 5 in a surface layer of the n-type silicon carbide epitaxial layer 2, at a surface thereof closest to the first main surface of the silicon carbide semiconductor base and the n-type high-concentration regions 6(2) are provided in regions sandwiched between the p-type base layer 3 and the second $p^+$-type base regions 5.

An interlayer insulating film (first interlayer insulating film) 11 is provided in an entire area of the first main surface of the silicon carbide semiconductor base so as to cover the gate electrodes 10 embedded in the trenches 18. The source electrodes (first first-electrodes) 13 are in contact with the $n^+$-type source regions 7 and the p-type base layer 3 via contact holes opened in the interlayer insulating film 11. In an instance in which the $p^{++}$-type contact regions 8 are provided, contact is with the $n^+$-type source regions 7 and the $p^{++}$-type contact regions 8. The source electrodes 13, for example, are formed by a NiSi film. The contact holes opened in the interlayer insulating film 11 have a striped-shape corresponding to the shape of the gate electrodes 10. The source electrodes 13 are electrically insulated from the gate electrodes 10 by the interlayer insulating film 11. On the source electrodes 13, the source electrode pad 15 is provided. The source electrode pad 15, for example, is formed by a first TiN film 25, a first Ti film 26, a second TiN film 27, a second Ti film 28, and an Al alloy film 29 stacked on one another. Between the source electrodes 13 and the interlayer insulating film 11, for example, a barrier metal (not depicted) that prevents diffusion of metal atoms from the source electrodes 13 to the gate electrodes 10 may be provided.

On a top of the source electrode pad 15, plating films 16 are selectively provided and a solder 17 is selectively provided on surfaces of the plating films 16. In the solder 17, the external terminal electrodes 19 that are a wiring material that leads out potential of the source electrodes 13 are provided. The external terminal electrodes 19 have a needle-like pin-shape and are bonded to the source electrode pad 15 in an upright state.

Portions of the surface of the source electrode pad 15 other than the plating films 16 are covered by the first protective films 21. In particular, the first protective films 21 are provided so as to cover the source electrode pad 15 and in openings of the first protective films 21, the external terminal electrodes 19 are bonded via the plating films 16 and the solder 17. A border between the plating films 16 and the first protective films 21 is covered by second protective films 23. The first protective films 21 and the second protective films 23, for example, are a polyimide film.

Next, as depicted in FIG. 4, in the first temperature sensing region 35a, the n-type silicon carbide epitaxial layer 2 is deposited on the first main surface (front surface), for example, the (0001)-plane (Si-face) of the $n^+$-type silicon carbide substrate 1, and the p-type base layer 3 is provided on the n-type silicon carbide epitaxial layer 2, on a first surface thereof closest to the first main surface of the silicon carbide semiconductor base. The $p^{++}$-type contact regions 8 may be provided in the p-type base layer 3, at the first surface of the p-type base layer 3, the first surface being the first main surface of the silicon carbide semiconductor base and the first $p^+$-type base regions 4 may be provided at a second surface of the p-type base layer 3 closest to the second main surface of the silicon carbide semiconductor base.

Further, a field insulating film 80 is provided on the $p^{++}$-type contact regions 8(3), and a p-type polysilicon layer (first second-polysilicon-layer of the second conductivity type) 81 and an n-type polysilicon layer (first first-polysilicon-layer of the first conductivity type) 82 are provided on the field insulating film 80. The p-type polysilicon layer 81 and the n-type polysilicon layer 82 are a polysilicon diode formed by a pn junction. Instead of the p-type polysilicon layer 81 and the n-type polysilicon layer 82, a diffusion diode formed by pn junctions between p-type diffusion regions and n-type diffusion regions may be set as the first temperature sensing region 35a. In this instance, for example, the p-type diffusion regions and the n-type diffusion regions configuring the diffusion diode may be selectively formed in n-type isolation regions (not depicted) selectively formed in the second p$^+$-type base regions 5.

On the p-type polysilicon layer 81, an anode electrode (first anode electrode) 84 is provided, and an anode electrode pad (first anode electrode pad) 35 is electrically connected to the p-type polysilicon layer 81 via the anode electrode 84. On the n-type polysilicon layer 82, a cathode electrode (first cathode electrode) 85 is provided, and a cathode electrode pad (first cathode electrode pad) 36 is electrically connected to the n-type polysilicon layer 82 via the cathode electrode 85. Similarly to the source electrode pad 15 of the main semiconductor element 42, the external terminal electrodes 19 are bonded to the first anode electrode pad 35 and the first cathode electrode pad 36 via the plating films 16 and the solder 17, and the first anode electrode pad 35 and the first cathode electrode pad 36 are protected by the first protective films 21 and the second protective films 23.

Further, a polysilicon diode may be provided in the n-type silicon carbide epitaxial layer 2 or in the first p$^+$-type base regions 4. For example, a temperature sensing trench (not depicted) that penetrates the p-type base layer 3 from the first surface of the p-type base layer 3 and reaches the first p$^+$-type base regions 4 (in an instance in which the first p$^+$-type base regions 4 are not provided, the n-type silicon carbide epitaxial layer 2) is provided, and the polysilicon diode may be provided in the temperature sensing trench, via an insulating film. The insulating film may have a film thickness that is greater than that of the gate insulating films 9 in the trenches 18 of the main semiconductor element 42 or may be about equal thereto. The temperature sensing trench may be formed to have a shape similar to that of the trenches 18 of the main semiconductor element 42 or may have a different shape. For example, the temperature sensing trench may have a trench width that is greater than that of the trenches 18 of the main semiconductor element 42 and/or a depth thereof may be increased.

In this instance, the diode of the first temperature sensing region 35*a* is provided in an insulating film embedded in the temperature sensing trench and is positioned closer to the heat source than conventionally and therefore, may accurately measure an internal temperature of the element and enhance the accuracy of the temperature measurement.

Next, as depicted in FIG. 3, the second temperature sensing region 35*b* has a structure similar to that of the first temperature sensing region 35*a*. The n-type silicon carbide epitaxial layer 2 is deposited on the first main surface (front surface) of the n$^+$-type silicon carbide substrate 1, for example, the (0001)-plane (Si-face), and the p-type base layer (second second-semiconductor layer of the second conductivity type) 3 is provided on the n-type silicon carbide epitaxial layer 2, on a first surface thereof closest to the first main surface of the silicon carbide semiconductor base. In the p-type base layer 3, p$^{++}$-type contact regions 8' may be provided at the first surface of the p-type base layer 3, and first p$^+$-type base regions 4' may be provided at a second surface of the p-type base layer 3 closest to the second main surface of the silicon carbide semiconductor base.

Further, a field insulating film 80' is provided on the p$^{++}$-type contact regions 8'(3), a p-type polysilicon layer (second second-polysilicon-layer of the second conductivity type) 81' and an n-type polysilicon layer (second first-polysilicon-layer of the first conductivity type) 82' are provided on the field insulating film 80'.

An anode electrode (second anode electrode) 84' is provided on the p-type polysilicon layer 81', and the second anode electrode pad (second anode electrode pad) 35' is electrically connected to the p-type polysilicon layer 81' via the anode electrode 84'. A cathode electrode (second cathode electrode) 85' is provided on the n-type polysilicon layer 82' and a second cathode electrode pad 36' is electrically connected to the n-type polysilicon layer 82' via the cathode electrode 85'. Similarly to the source electrode pad 15 of the main semiconductor element 42, the external terminal electrodes 19' are bonded to the second anode electrode pad 35' and the second cathode electrode pad 36' via plating films 16' and a solder 17', and the second anode electrode pad 35' and the second cathode electrode pad 36' are protected by the first protective films 21' and the second protective films 23'.

A polysilicon diode of the second temperature sensing region 35*b*, similarly to that of the first temperature sensing region 35*a*, may be provided in the n-type silicon carbide epitaxial layer 2 or the first p$^+$-type base regions 4'.

Next, as depicted in FIG. 3, the current sensing region (second MOS structure region) 37*a* has a structure similar to that of the main semiconductor element 42. The current sensing region 37*a* includes the p-type base layer 3, n$^+$-type source regions (second first-semiconductor-regions of the first conductivity type) 7", p$^{++}$-type contact regions 8", trenches (second trenches) 18", gate insulating films (second gate insulating films) 9", gate electrodes (second gate electrodes) 10", and an interlayer insulating film (second interlayer insulating film) 11". Components of the MOS gates of the current sensing region 37*a* are provided in the main non-operating region 42*b*.

In the current sensing region 37*a* as well, similarly to the main semiconductor element 42, the p$^{++}$-type contact regions 8" may be omitted. The current sensing region 37*a*, similarly to the main semiconductor element 42, may have n-type high-concentration regions 6". Further, the current sensing region 37*a*, similarly to the main semiconductor element 42, may have first p$^+$-type base regions 4" and second p$^+$-type base regions 5". The current sensing region 37*a* has source electrodes (second first-electrodes) 13" that have a structure similar to the structure of the source electrodes 13 of the main semiconductor element 42, and on the source electrodes 13", a source electrode pad 15 is provided. On the source electrode pad 15, the structure is similar to the structure of the top of the source electrode pad 15 of the main semiconductor element 42.

Next, a method of manufacturing the silicon carbide semiconductor device according to the first embodiment will be described. FIGS. 6, 7, 8, 9, 10, and 11 are cross-sectional views schematically depicting states of the silicon carbide semiconductor device according to the first embodiment during manufacture.

Figure 6:
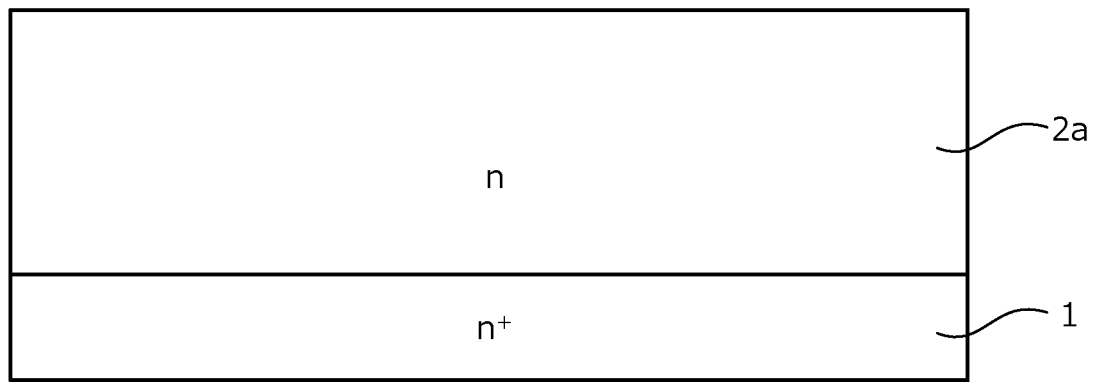
FIG. 6 is a cross-sectional view schematically depicting a state of the silicon carbide semiconductor device according to the first embodiment during manufacture.

First, the n$^+$-type silicon carbide substrate 1 containing an n-type silicon carbide is prepared. Subsequently, on the first main surface of the n$^+$-type silicon carbide substrate 1, a first n-type silicon carbide epitaxial layer 2*a* containing silicon carbide is epitaxially grown to a thickness of, for example, about 30 μm while an n-type impurity, for example, nitrogen atoms, is doped. The first n-type silicon carbide epitaxial layer 2*a* becomes the n-type silicon carbide epitaxial layer 2. The state up to here is depicted in FIG. 6.

Next, on the surface of the first n-type silicon carbide epitaxial layer 2*a*, an ion implantation mask having predetermined openings is formed by a photolithographic technique using, for example, an oxide film. Subsequently, a p-type impurity such as aluminum is implanted in the openings of the oxide film, thereby forming lower first p$^+$-type base regions 4*a* of a depth of about 0.5 μm. The second p$^+$-type base regions 5 forming the bottoms of the trenches 18 may be formed concurrently with the lower first p$^+$-type base regions 4a. Formation is such that a distance between the lower first p$^+$-type base regions 4a and the second p$^+$-type base regions 5 adjacent to one another is about 1.5 μm. An impurity concentration of the lower first p$^+$-type base regions 4a and the second p$^+$-type base regions 5 is set to, for example, about $5 \times 10^{18}/cm^3$.

Figure 7:
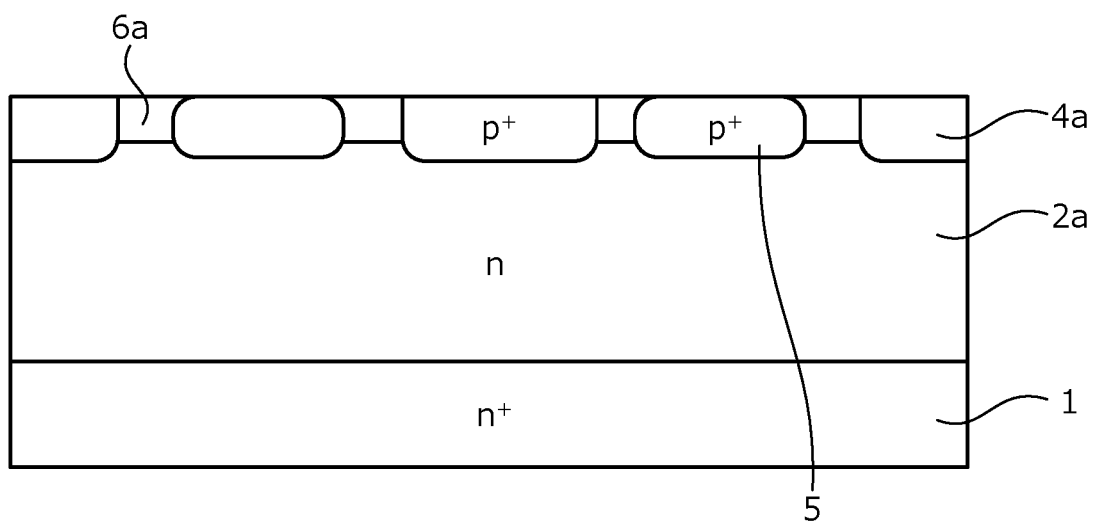
FIG. 7 is a cross-sectional view schematically depicting a state of the silicon carbide semiconductor device according to the first embodiment during manufacture.

Next, portions of the ion implantation mask are removed, an n-type impurity such as nitrogen is implanted in the openings, thereby forming in portions of a surface layer of the first n-type silicon carbide epitaxial layer 2a, lower n-type high-concentration regions 6a of a depth of, for example, about 0.5 μm. An impurity concentration of the lower n-type high-concentration regions 6a is set to, for example, about $1 \times 10^{17}/cm^3$. The state up to here is depicted in FIG. 7.

Next, on the surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer 2b is set so as to become about $3 \times 10^{15}/cm^3$. Hereinafter, the first n-type silicon carbide epitaxial layer 2a and the second n-type silicon carbide epitaxial layer 2b collectively are the n-type silicon carbide epitaxial layer 2.

Next, on the surface of the second n-type silicon carbide epitaxial layer 2b, an ion implantation mask having predetermined openings is formed by photolithography using, for example, an oxide film. Subsequently, a p-type impurity such as aluminum is implanted in the openings of the oxide film, thereby forming upper first p$^+$-type base regions 4b of a depth of about 0.5 μm, overlapping the lower first p$^+$-type base regions 4a. The lower first p$^+$-type base regions 4a and the upper first p$^+$-type base regions 4b form a continuous region, forming the first p$^+$-type base regions 4. An impurity concentration of the upper first p$^+$-type base regions 4b is set to become, for example, about $5 \times 10^{18}/cm^3$.

Figure 8:
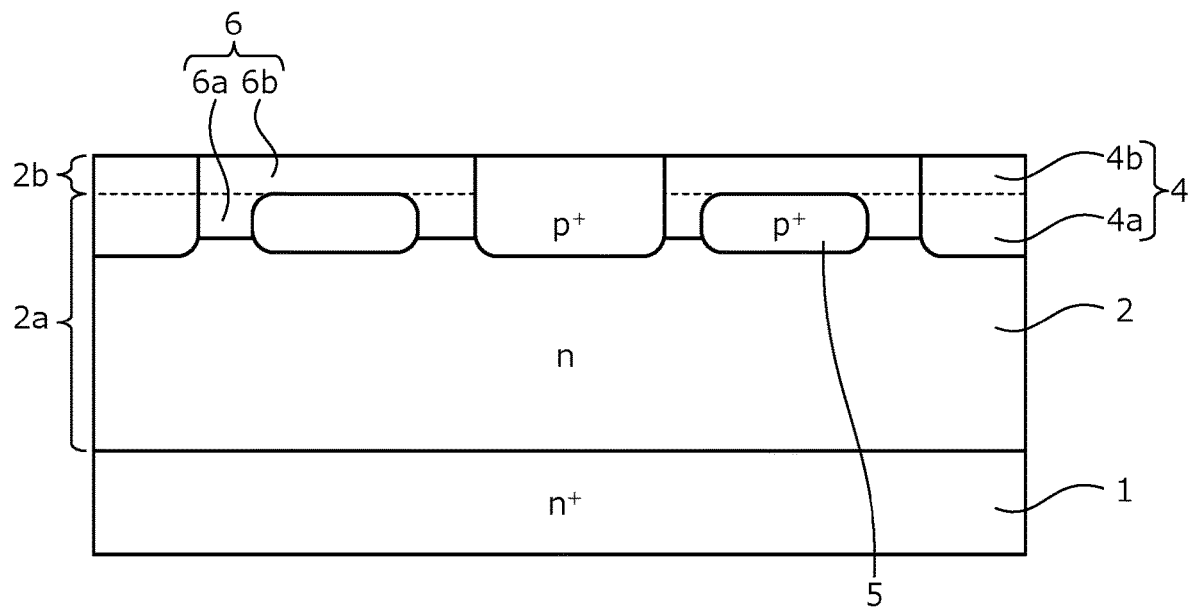
FIG. 8 is a cross-sectional view schematically depicting a state of the silicon carbide semiconductor device according to the first embodiment during manufacture.

Next, portions of the ion implantation mask are removed, an n-type impurity such as nitrogen is implanted in the openings, thereby forming in portions of a surface layer of the second n-type silicon carbide epitaxial layer 2b, upper n-type high-concentration regions 6b of a depth of, for example, about 0.5 μm. An impurity concentration of the upper n-type high-concentration regions 6b is set to, for example, about $1 \times 10^{17}/cm^3$. The upper n-type high-concentration regions 6b and the lower n-type high-concentration regions 6a are formed to at least partially contact one another to form the n-type high-concentration regions 6. However, in some instances, the n-type high-concentration regions 6 may be provided in an entire area of the substrate surface or may be omitted. The state up to here is depicted in FIG. 8.

Next, on the surface of the n-type silicon carbide epitaxial layer 2, the p-type base layer 3 doped with a p-type impurity such as aluminum is formed to have a thickness of about 1.3 μm. An impurity concentration of the p-type base layer 3 is set to about $4 \times 10^{17}/cm^3$.

Figure 9:
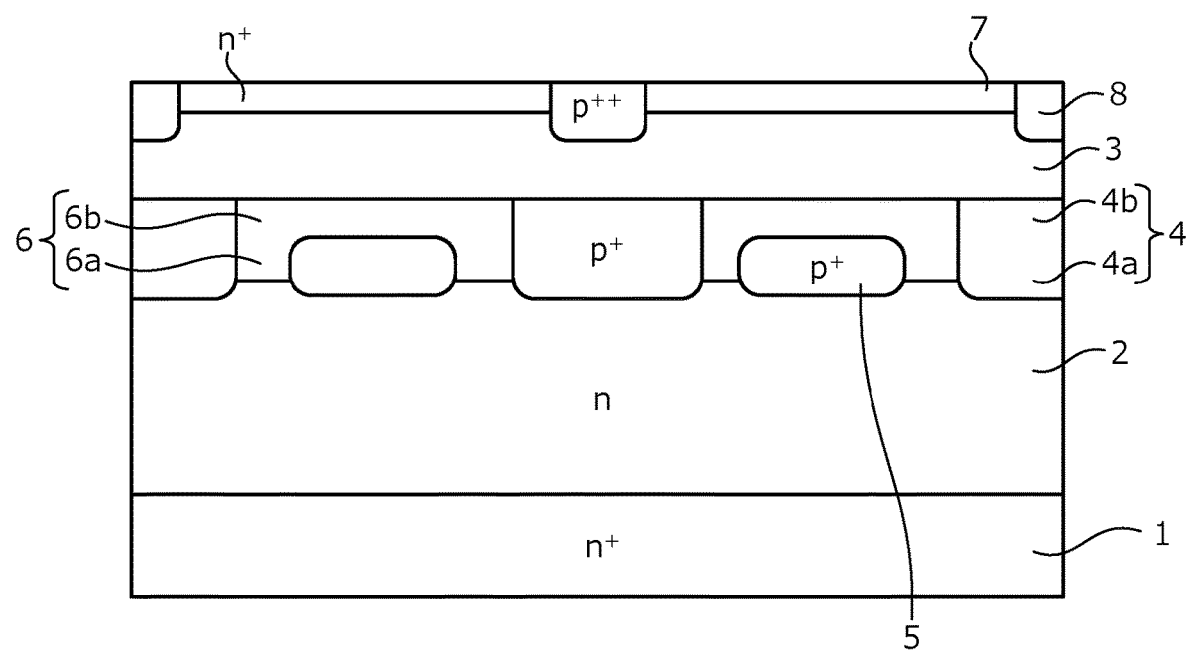
FIG. 9 is a cross-sectional view schematically depicting a state of the silicon carbide semiconductor device according to the first embodiment during manufacture.

Next, on the surface of the p-type base layer 3, an ion implantation mask having predetermined openings is formed by photolithography using, for example, an oxide film. An n-type impurity such as phosphorus (P) is ion-implanted in the openings, thereby forming in the p-type base layer 3, the n$^+$-type source regions 7 at portions of the surface thereof. An impurity concentration of the n$^+$-type source regions 7 is set to be higher than the impurity concentration of the p-type base layer 3. Next, the ion implantation mask used in the formation of the n$^+$-type source regions 7 is removed and by a similar method, an ion implantation mask having predetermined openings may be formed, a p-type impurity such as aluminum may be ion-implanted in portions of the surface of the p-type base layer 3, and the p$^{++}$-type contact regions 8 may be formed. An impurity concentration of the p$^{++}$-type contact regions 8 is set to be higher than the impurity concentration of the p-type base layer 3. The state up to here is depicted in FIG. 9.

Next, a heat treatment (annealing) is performed under an inert gas atmosphere of 1700 degrees C., thereby implementing an activation process for the first p$^+$-type base regions 4, the second p$^+$-type base regions 5, the n$^+$-type source regions 7, and the p$^{++}$-type contact regions 8. As described above, the ion implanted regions may be collectively activated by a single session of the heat treatment or may be activated by performing the heat treatment each time ion implantation is performed.

Figure 10:
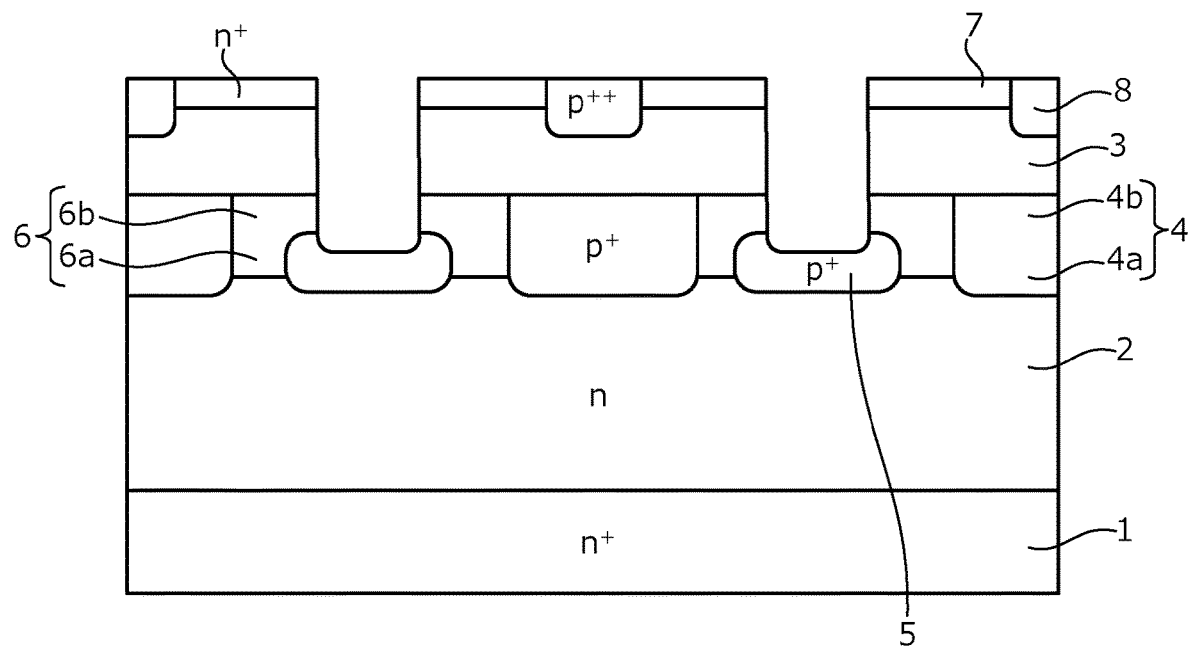
FIG. 10 is a cross-sectional view schematically depicting a state of the silicon carbide semiconductor device according to the first embodiment during manufacture.

Next, on the surface of the p-type base layer 3, a trench formation mask having predetermined openings is formed by photolithography using, for example, an oxide film. Next, the trenches 18 that penetrate the p-type base layer 3 and reach the n-type high-concentration regions 6(2) are formed by etching. The bottoms of the trenches 18 may reach the second p$^+$-type base regions 5 formed in the n-type high-concentration regions 6(2). Next, the trench formation mask is removed. The state up to here is depicted in FIG. 10.

Next, along the surfaces of the n$^+$-type source regions 7 and the bottoms and sidewalls of the trenches 18, the gate insulating films 9 are formed. The gate insulating films 9 may be formed by thermal oxidation of a temperature of about 1000 degrees C. under an oxygen atmosphere. Further, the gate insulating films 9 may be formed by a deposition method by a chemical reaction such as that for a high temperature oxide (HTO).

Next, on the gate insulating films 9, a polycrystal silicon layer doped with, for example, phosphorus atoms is formed. The polycrystal silicon layer may be formed so as to be embedded in the trenches 18. The polycrystal silicon layer is patterned by photolithography to be left in the trenches 18 and thereby form the gate electrodes 10.

Figure 11:
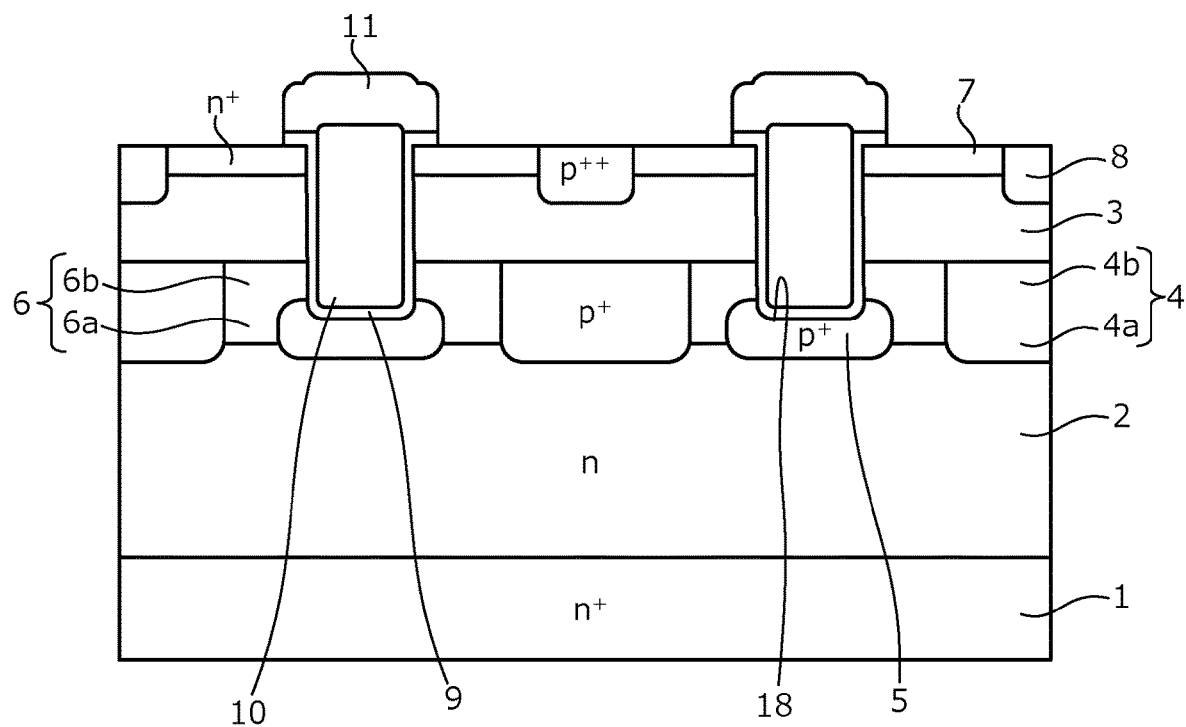
FIG. 11 is a cross-sectional view schematically depicting a state of the silicon carbide semiconductor device according to the first embodiment during manufacture.

Next, for example, a phosphate glass is deposited to have a thickness of about 1 μm and to cover the gate insulating films 9 and the gate electrodes 10, thereby forming the interlayer insulating film 11. Next, the barrier metal (not depicted) containing titanium (Ti) or titanium nitride (TiN) may be formed so as to cover the interlayer insulating film 11. The interlayer insulating film 11 and the gate insulating films 9 are patterned by photolithography, thereby forming contact holes exposing the n$^+$-type source regions 7 and the p$^{++}$-type contact regions 8. Thereafter, the interlayer insulating film 11 is planarized by a heat treatment (reflow). The state up to here is depicted in FIG. 11.

Next, in the contact holes and on the interlayer insulating film 11, a conductive film that forms the source electrodes 13 is provided. The conductive film is selectively removed, leaving portions thereof that become the source electrodes 13 only in the contact holes so that the n$^+$-type source regions 7 and the p$^{++}$-type contact regions 8 are in contact with the source electrodes 13. Next, portions other than the source electrodes 13 of the contact holes are selectively removed. For example, after a nickel film is formed in the contact holes, a heat treatment under an inert gas atmosphere of about 1000 degrees C. is performed, thereby forming a nickel silicide film in ohmic contact with the n$^+$-type source regions 7 and the p$^{++}$-type contact regions 8. Thereafter, unreacted portions of the nickel film are removed, whereby the source electrodes 13 are formed.

At this time, nickel, etc. for the back electrode 14 is provided also on the second main surface of the n$^+$-type silicon carbide substrate 1 and when the heat treatment under the inert gas atmosphere of about 1000 degrees C. is performed, the back electrode 14 in ohmic contact with the n$^+$-type silicon carbide substrate 1 is concurrently formed.

Next, for example, by a spattering technique, on the source electrodes 13 of the front surface of the silicon carbide semiconductor base and on top of the interlayer insulating film 11, an electrode pad that forms the source electrode pad 15 is deposited. For example, by a spattering technique, the first TiN film 25, the first Ti film 26, the second TiN film 27, and the second Ti film 28 are stacked and the Al alloy film 29 is further formed so that a thickness becomes, for example, about 5 μm. The Al alloy film 29, for example, is an Al—Si film or an Al—Si—Cu film. The Al alloy film 29 may be an Al film. This conductive film is patterned by photolithography to be left in the active region 40 of the element overall, thereby forming the source electrode pad 15. The thickness of a portion of the electrode pad on the interlayer insulating film 11 may be, for example, 5 μm. The electrode pad may be formed by aluminum (Al—Si), for example, containing silicon at a rate of 1%. Next, the source electrode pad 15 is selectively removed.

Next, a polyimide film is formed so as to cover the source electrode pad 15. Next, the polyimide film is selectively removed by photolithography and etching, whereby the first protective films 21 are formed covering each of the source electrode pads 15 and openings are formed in the first protective films 21.

Next, on top of the source electrode pad 15, the plating films 16 are selectively formed, and the second protective films 23 covering borders between the plating films 16 and the first protective films 21 are formed. Next, the external terminal electrodes 19 are formed on the plating films 16 via the solder 17.

Elements other than the main semiconductor element 42 (for example, the current sensing region 37*a*, for example, a diffusion diode forming the over-voltage protecting region, a complementary MOS (CMOS) configuring the arithmetic circuit region) suffice to be formed in the main non-operating region 42*b* of the semiconductor chip 60 concurrently with corresponding components of the main semiconductor element 42 during the formation of the components of the main semiconductor element 42 described above. Further, formation thereof may be by processes separate from those of the main semiconductor element 42.

Further, the first and the second temperature sensing regions 35*a*, 35*b* are formed as follows. Before the formation of the electrode pad when the main semiconductor element 42 is formed, the p-type polysilicon layers 81, 81', the n-type polysilicon layers 82, 82', the anode electrode 84, 84', and the cathode electrode 85, 85' are formed on field insulating films 80, 80' by a general method.

Further, the p-type polysilicon layers 81, 81' and the n-type polysilicon layers 82, 82' of the first and the second temperature sensing regions 35*a*, 35*b*, for example, may be formed concurrently with the gate electrodes 10 of the current sensing region 37*a* and the main semiconductor element 42. The field insulating films 80, 80' may be portions of the interlayer insulating films 11 of the current sensing region 37*a* and the main semiconductor element 42. In this instance, the p-type polysilicon layer 81 and the n-type polysilicon layer 82 of the first temperature sensing region 35*a* is formed after the formation of the interlayer insulating films 11 of the current sensing region 37*a* and the main semiconductor element 42.

Next, the first and the second anode electrode pads 35, 35' and the first and the second cathode electrode pads 36, 36' respectively in contact with the anode electrode 84, 84' and the cathode electrode 85, 85' are formed. The first and the second anode electrode pads 35, 35' and the first and the second cathode electrode pads 36, 36' may formed with the source electrode pad 15 and may have a stacked structure similar to that of the source electrode pad 15.

Next, a polyimide film is formed so as to cover the first and the second anode electrode pads 35, 35' and the first and the second cathode electrode pads 36, 36'. Next, the polyimide film is selectively removed by photolithography and etching, the first protective films 21, 21' covering the first and the second anode electrode pads 35, 35' and the first and the second cathode electrode pads 36, 36', respectively, are formed, and openings are formed in the first protective films 21, 21'.

Next, the plating films 16, 16' are selectively formed on tops of the first and the second anode electrode pads 35, 35' and the first and the second cathode electrode pads 36, 36', and the second protective films 23, 23' covering borders between the plating films 16, 16' and the first protective films 21, 21' are formed. Next, the external terminal electrodes 19, 19' are formed on the plating films 16, 16' via the solder 17, 17', whereby the first and the second temperature sensing regions 35*a*, 35*b*.

Further, when the polysilicon diode is formed in a temperature sensing trench (not depicted), the p-type polysilicon layers 81, 81' and the n-type polysilicon layers 82, 82' are formed as follows. The temperature sensing trench is formed concurrently when the trenches 18 of the main semiconductor element 42 are formed. Next, insulating films of the first and the second temperature sensing regions 35*a*, 35*b* are formed when the gate insulating films 9 of the main semiconductor element 42 are formed. At this time, the insulating films may be formed to have a film thickness greater than that of the gate insulating films 9 or may be formed to have a thickness about equal thereto. Next, non-doped polysilicon is formed on tops of the formed insulating films. An anode portion and a cathode portion are formed in portions of the formed polysilicon, whereby the p-type polysilicon layers 81, 81' and the n-type polysilicon layers 82, 82' are formed.

As described above, according to the silicon carbide semiconductor device according to the first embodiment, the second temperature sensing region is provided in the current sensing region. As a result, detection of abnormal heat generated by the current sensing region becomes possible. Therefore, even when the silicon carbide semiconductor device is used under large currents, high frequencies, and high temperatures, instances in which the temperature becomes that under which the current sensing region cannot operate properly and overcurrent cannot be detected are prevented, thereby enabling improvement of the reliability.

Further, electrode pads for supplying current from an external power source circuit to the diode of the first temperature sensing region of the main effective region and the diode of the second temperature sensing region of the current sensing region are respectively provided and therefore, the temperature of abnormal heat generated by the current sensing region is monitored separately from the main effective region. As a result, similarly to the main effective region, fluctuation values of characteristics may be efficiently monitored for the current sensing region as a functional element.

Figure 13:
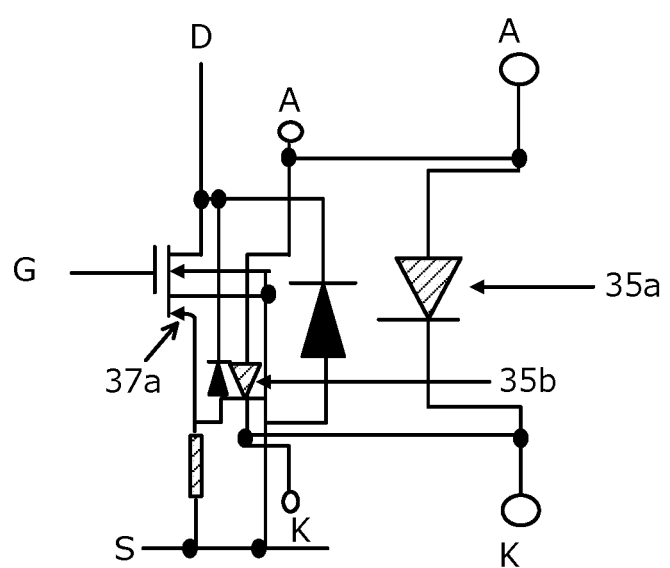
FIG. 13 is an equivalent circuit diagram of a current sensing region and a temperature sensing region of the silicon carbide semiconductor device according to the second embodiment.

Next, a semiconductor device according to a second embodiment will be described. FIG. 12 is a top view of a structure of the silicon carbide semiconductor device according to the second embodiment. FIG. 13 is an equivalent circuit diagram of a current sensing region and a temperature sensing region of the silicon carbide semiconductor device according to the second embodiment. The semiconductor device according to the second embodiment differs from the semiconductor device according to the first embodiment in that the first temperature sensing region 35a of the main effective region 42a and the second temperature sensing region 35b of the current sensing region 37a share an electrode pad for supply current from an external power source circuit.

In other words, in the second embodiment, the second temperature sensing region 35b is not provided with the second anode electrode pad 35' or the second cathode electrode pad 36', the anode electrode 84 of the second temperature sensing region 35b is connected to the first anode electrode pad 35, and the cathode electrode 85 of the second temperature sensing region 35b is connected to the first cathode electrode pad 36.

In this manner, in the second embodiment, the electrode pad for supplying current from an external power source circuit is shared and therefore, the arithmetic area of the main non-operating region 42b may be reduced by that of the second anode electrode pad 35' and the second cathode electrode pad 36'. Further, the monitoring temperature of the first and the second temperature sensing regions 35a, 35b is the same as that for the main effective region 42a and the current sensing region 37a.

Herein, a structure of the silicon carbide semiconductor device according to the second embodiment along cutting lines A-A' and B-B' in FIG. 12 is similar to that of the first embodiment and therefore, description thereof is omitted (refer to FIGS. 3 and 4). A method of manufacturing a silicon carbide semiconductor device according to the second embodiment is similar to the method of manufacturing a silicon carbide semiconductor device according to the first embodiment and therefore, description thereof is omitted herein.

As described above, according to the silicon carbide semiconductor device according to the second embodiment, similarly to the first embodiment, detection of abnormal heat generated by the current sensing region becomes possible. Further, in the second embodiment, the electrode pad for supplying current from an external power source circuit is shared by the first and the second temperature sensing regions and therefore, the arithmetic area of the main non-operating region may be reduced by that of the second anode electrode pad and the second cathode electrode pad.

Figure 14:
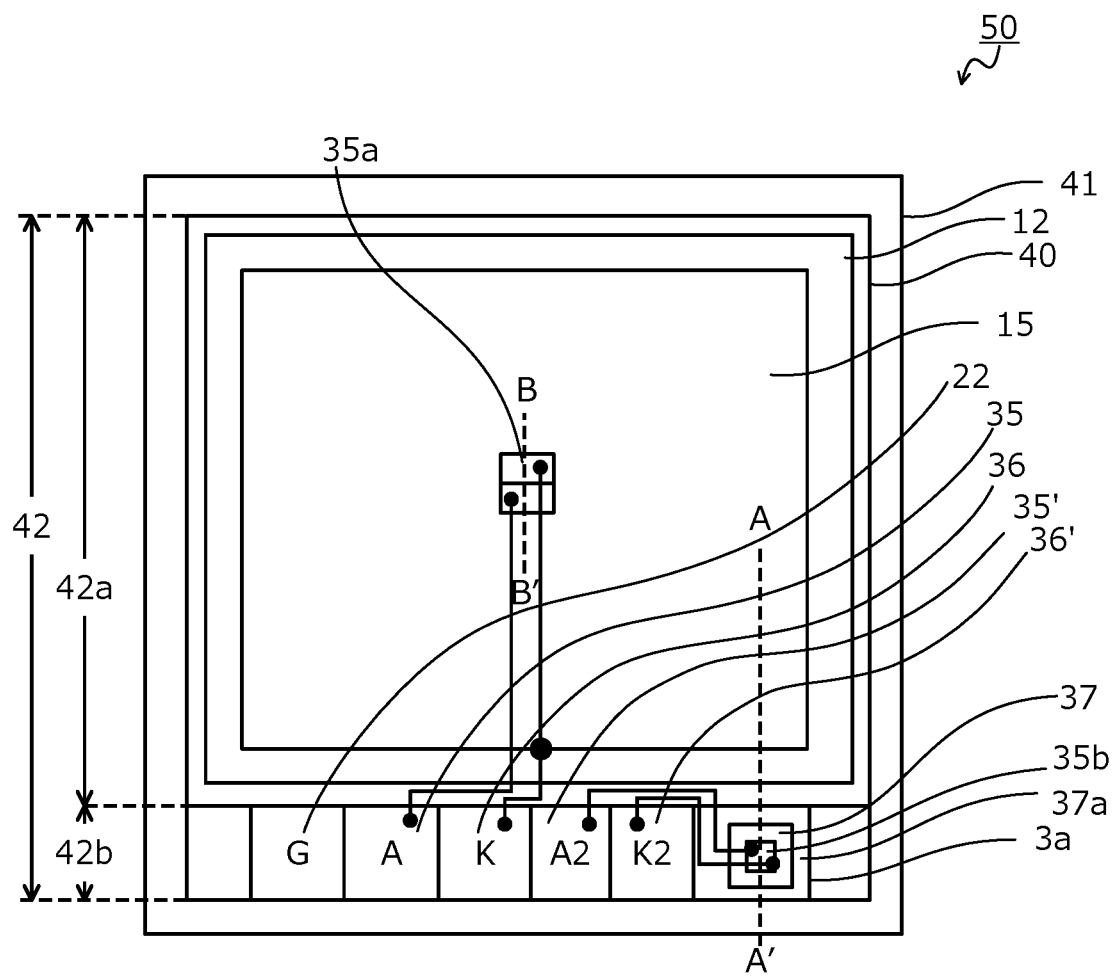
FIG. 14 is a top view of a structure of a silicon carbide semiconductor device according to a third embodiment.
Figure 15:
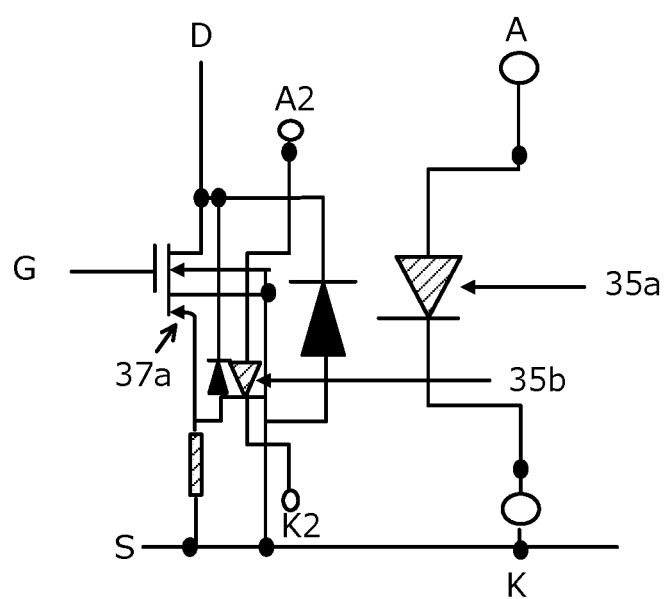
FIG. 15 is an equivalent circuit diagram of a current sensing region and a temperature sensing region of the silicon carbide semiconductor device according to the third embodiment.

Next, a semiconductor device according to a third embodiment will be described. FIG. 14 is a top view of a structure of the silicon carbide semiconductor device according to the third embodiment. FIG. 15 is an equivalent circuit diagram of a current sensing region and a temperature sensing region of the silicon carbide semiconductor device according to the third embodiment. The semiconductor device according to the third embodiment differs from the semiconductor device according to the first embodiment in that the first cathode electrode pad 36 of the first temperature sensing region 35a of the main effective region 42a is connected to the source electrode pad 15.

As a result, the source electrodes 13 and the cathode electrode 85 of the first temperature sensing region 35a have equal potentials. Current flows to a lower potential and therefore, when a path is long and noise is picked up, the current value oscillates and the forward current Vf of the diode of the first temperature sensing region 35a cannot be accurately measured. Therefore, by a connection to the source electrodes 13 midway of the cathode electrode 85 of the first temperature sensing region 35a, the long path is eliminated, enabling the first temperature sensing region 35a to have a structure resistant to noise.

Herein, the structure of the silicon carbide semiconductor device according to the third embodiment along cutting lines A-A' and B-B' in FIG. 14 is similar to that of the first embodiment and therefore, description thereof is omitted (refer to FIGS. 3 and 4). A method of manufacturing a silicon carbide semiconductor device according to the third embodiment is similar to the method of manufacturing a silicon carbide semiconductor device according to the first embodiment and therefore, description thereof is omitted.

As described above, according to the silicon carbide semiconductor device according to the third embodiment, similarly to the first embodiment, detection of abnormal heat generated by the current sensing region becomes possible. Further, in the third embodiment, the source electrodes and the cathode electrode of the first temperature sensing region have equal potentials, thereby enabling the first temperature sensing region to have a structure resistant to noise.

Figure 16:
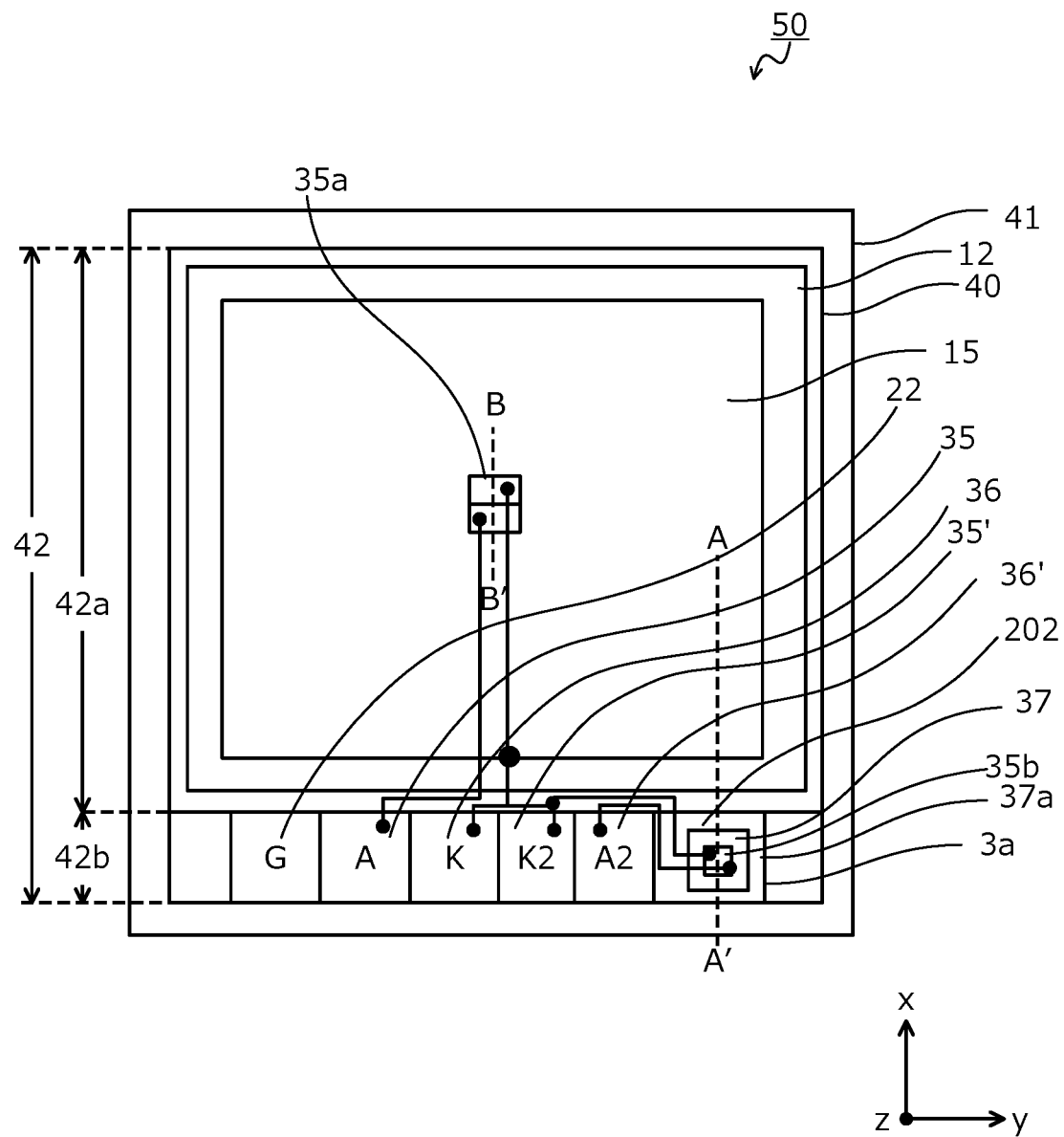
FIG. 16 is a top view of a structure of a silicon carbide semiconductor device according to a fourth embodiment.
Figure 17:
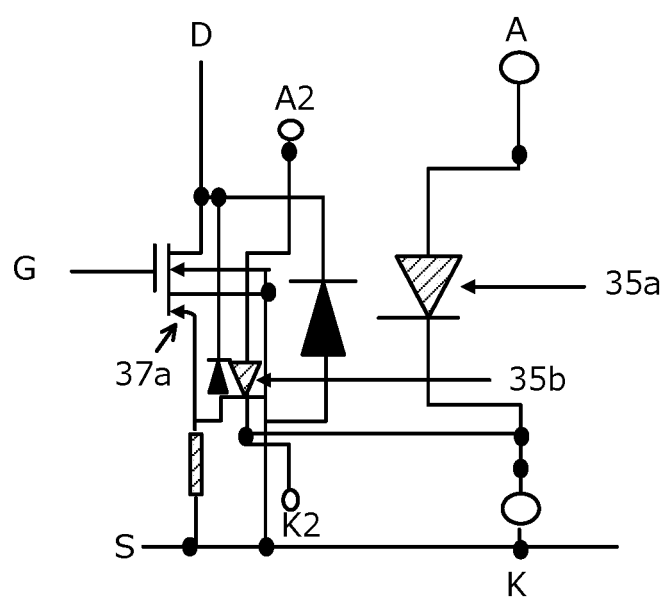
FIG. 17 is an equivalent circuit diagram of a current sensing region and a temperature sensing region of the silicon carbide semiconductor device according to the fourth embodiment.
Figure 18:
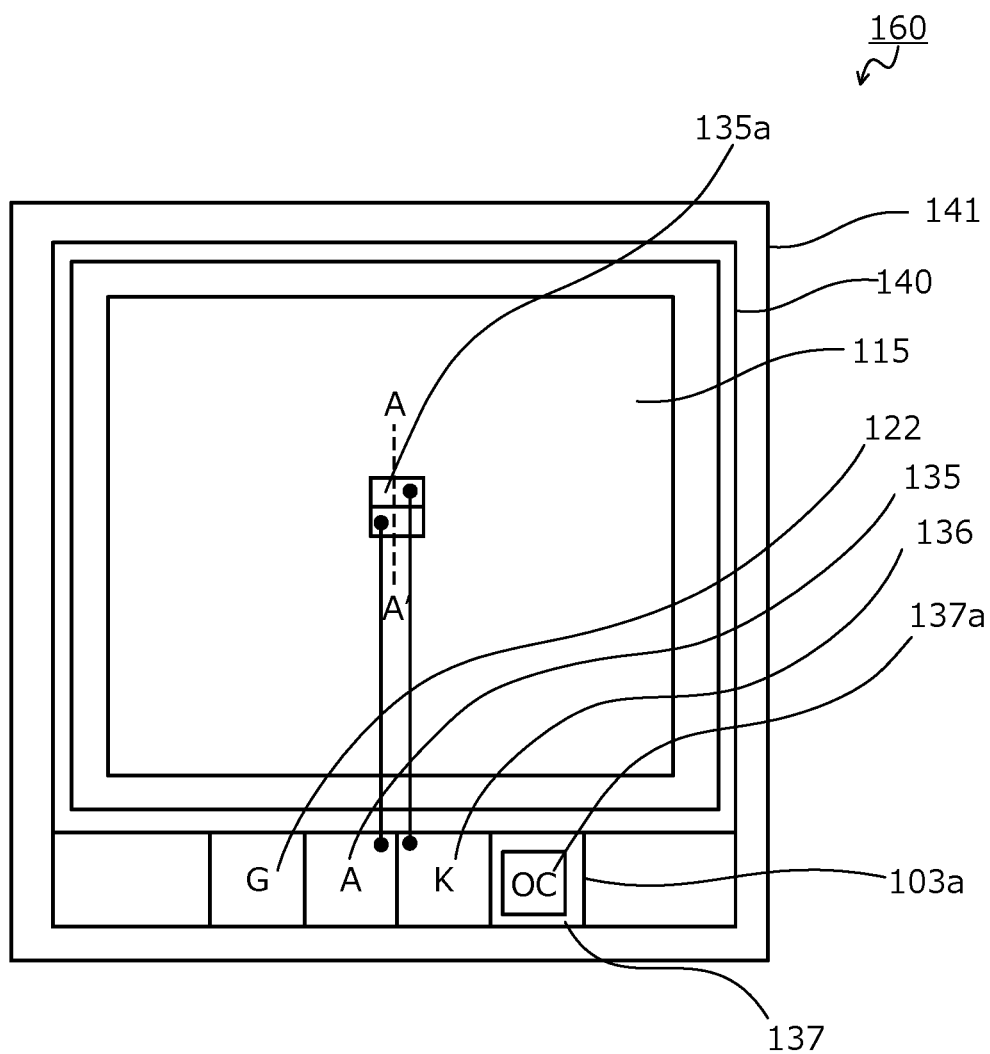
FIG. 18 is a top view of a structure of a conventional silicon carbide semiconductor device.
Figure 19:
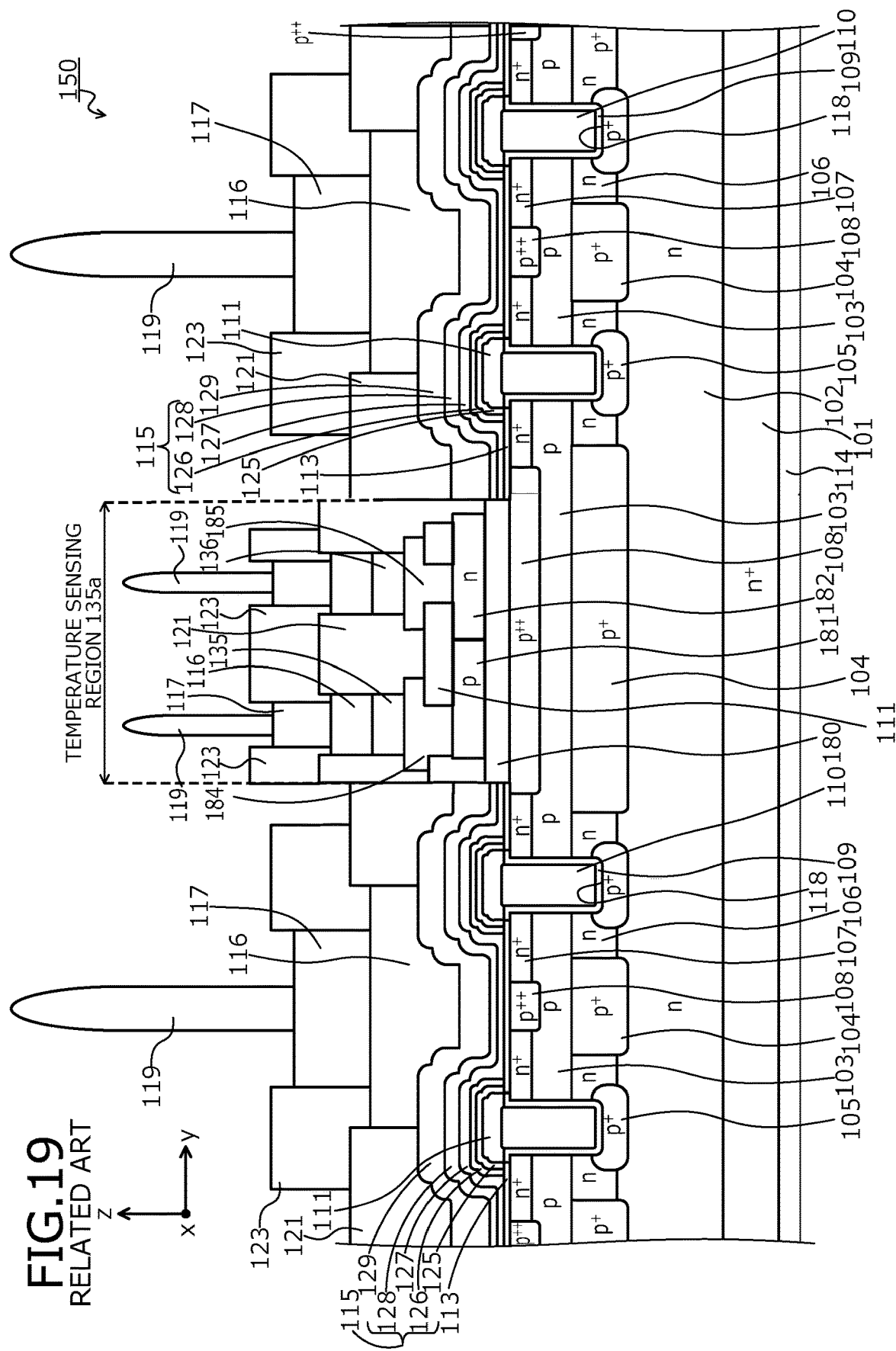
FIG. 19 is a cross-sectional view of the structure of the conventional silicon carbide semiconductor device along cutting line A-A' in FIG. 18.
Figure 20:
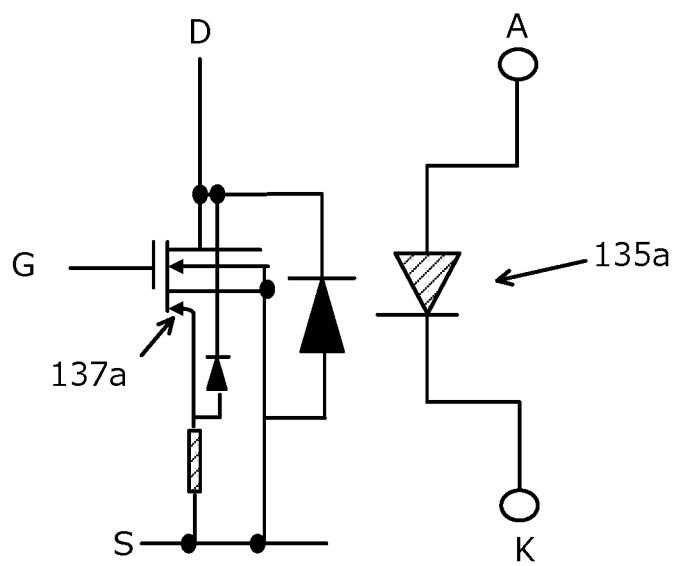
FIG. 20 is an equivalent circuit diagram of a current sensing region and a temperature sensing region of the conventional silicon carbide semiconductor device.

Next, a semiconductor device according to a fourth embodiment will be described. FIG. 16 is a top view of a structure of the silicon carbide semiconductor device according to the fourth embodiment. FIG. 17 is an equivalent circuit diagram of a current sensing region and a temperature sensing region of the silicon carbide semiconductor device according to the fourth embodiment. The semiconductor device according to the fourth embodiment differs from the semiconductor device according to the third embodiment in that the second cathode electrode pad 36' of the second temperature sensing region 35b is connected to the first cathode electrode pad 36 of the first temperature sensing region 35a.

As a result, the cathode electrode 85 of the first temperature sensing region 35a and the second cathode electrode pad 36' of the second temperature sensing region 35b have potentials equal to that of the source electrodes 13. Therefore, in addition to effects similar to those of the third embodiment, by a connection to the source electrodes 13 midway of the cathode electrode 85' of the second temperature sensing region 35b, the long path is eliminated, enabling the second temperature sensing region 35b to have a structure resistant to noise. Further, in the fourth embodiment, the second cathode electrode pad 36' and the second anode electrode pad 35' may be shared.

Herein, a structure of the silicon carbide semiconductor device according to the fourth embodiment along cutting lines A-A' and B-B' in FIG. 16 are similar to those of the first embodiment and therefore, description thereof is omitted (refer to FIGS. 3 and 4). A method of manufacturing a silicon carbide semiconductor device according to the fourth embodiment is similar to the method of manufacturing a silicon carbide semiconductor device according to the first embodiment and therefore, description is omitted.

As described above, according to the silicon carbide semiconductor device according to the fourth embodiment, similarly to the first embodiment, detection of abnormal heat generated by the current sensing region becomes possible. Further, in the fourth embodiment, the cathode electrode of the first temperature sensing region and the second cathode electrode pad of the second temperature sensing region have potential equal to that of source electrodes and the first temperature sensing region and the second temperature sensing region may have structures resistant to oscillation.

In the foregoing, while the present invention is described taking, as an example, an instance in which a main surface of a silicon carbide substrate containing silicon carbide is a (0001) plane and a MOS is configured on the (0001) plane, without limitation hereto, various modifications are possible such as relative to the wide bandgap semiconductor, plane orientation of the substrate main surface, etc.

Further, in the present invention, without limitation to the embodiments described above, various modifications within a range not departing from the spirit of the invention are possible. For example, in the active region, arrangement of the main non-operating region may be variously modified, the main non-operating region may be disposed near a center of the active region and a periphery thereof may be surrounded by the main effective region. Further, for example, instead of the trench gate structure, a planar gate structure may be provided. Further, the present invention is applicable in instances in which instead of silicon carbide, a wide bandgap semiconductor other than silicon carbide is used as a semiconductor material or a Si semiconductor is used as a semiconductor material. Further, the present invention is similarly implemented when the conductivity types (n-type, p-type) are reversed.

According to the invention described above, the second temperature sensing region is provided in the current sensing region (second MOS structure region). As a result, detection of abnormal heat generated by the current sensing region becomes possible. Therefore, even when the silicon carbide semiconductor device is used under large currents, high frequencies, and high temperatures, instances in which the temperature becomes that under which the current sensing region cannot operate properly and overcurrent cannot be detected are prevented, thereby enabling improvement of the reliability.

The semiconductor device according to the invention achieves an effect in that a semiconductor device that is highly reliable even when applied under large currents, high frequencies, and high temperatures may be provided.

As described above, the semiconductor device according to the present invention is useful for semiconductor devices used in power converting equipment and power source devices such as in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, having
a first metal oxide semiconductor (MOS) structure region,
a second MOS structure region,
a first temperature sensing region through which a main current of the semiconductor device passes when the first MOS structure region is in an ON state, and
a second temperature sensing region through which the main current passes when the second MOS structure region is in the ON state,
the semiconductor device comprising:
a semiconductor substrate of a first conductivity type, having a front surface and a back surface;
a first semiconductor layer of the first conductivity type, provided on the front surface of the semiconductor substrate, the first semiconductor layer having an impurity concentration lower than an impurity concentration of the semiconductor substrate, and having a first surface and a second surface that are opposite to each other, the second surface thereof facing the semiconductor substrate;
in the first MOS structure region:
a first second-semiconductor-layer of a second conductivity type, provided on the first surface of the first semiconductor layer and having a first surface and a second surface that are opposite to each other, the second surface thereof facing the semiconductor substrate,
a plurality of first first-semiconductor regions of the first conductivity type, selectively provided in the first second-semiconductor-layer at the first surface thereof, each first first-semiconductor region having a first surface and a second surface that are opposite to each other, the second surface thereof facing the semiconductor substrate,
a plurality of first gate insulating films each having a first surface and a second surface that are opposite to each other, the second surface thereof being in contact with the first second-semiconductor-layer,
a plurality of first gate electrodes provided on the first surfaces of the first gate insulating films, respectively, and
a plurality of first first-electrodes provided on the first surface of the first second-semiconductor-layer and the first surfaces of the first first-semiconductor regions;
in the second MOS structure region:
a second second-semiconductor-layer of the second conductivity type, provided on the first surface of the first semiconductor layer and having a first surface and a second surface that are opposite to each other, the second surface thereof facing the semiconductor substrate,
a plurality of second first-semiconductor-regions of the first conductivity type, selectively provided in the second second-semiconductor-layer at the first surface thereof, each second first-semiconductor-region having a first surface and a second surface that are opposite to each other, the second surface thereof facing the semiconductor substrate;
a plurality of second gate insulating films each having a first surface and a second surface, the second surface thereof being in contact with the second second-semiconductor-layer;
a plurality of second gate electrodes provided on the first surfaces of the second gate insulating films, respectively, and
a plurality of second first-electrodes provided on the first surface of the second second-semiconductor-layer and the first surfaces of the second first-semiconductor-regions;
in the first temperature sensing region:
the first second-semiconductor-layer,
a first first-polysilicon-layer of the first conductivity type and a first second-polysilicon-layer of the second conductivity type formed on the first second-semiconductor-layer or in the first semiconductor layer,
a first cathode electrode electrically connected to the first first-polysilicon-layer, and
a first anode electrode electrically connected to the first second-polysilicon-layer;
in the second temperature sensing region:
the second second-semiconductor-layer,
a second first-polysilicon-layer of the first conductivity type and a second second-polysilicon-layer of the second conductivity type formed on the second second-semiconductor-layer or in the first semiconductor layer,
a second cathode electrode electrically connected to the second first-polysilicon-layer, and a second anode electrode electrically connected to the second second-polysilicon-layer; and
a second electrode provided on the back surface of the semiconductor substrate.

2. The semiconductor device according to claim 1, wherein
the plurality of second first-semiconductor-regions, the plurality of second gate insulating films, the plurality of second gate electrodes, the plurality of second first-electrodes, the second second-semiconductor-layer, and a part of each of the semiconductor substrate, the first semiconductor layer, and the second electrode that is in the second MOS structure region form a second MOS structure, which detects overcurrent flowing in the first MOS structure region.

3. The semiconductor device according to claim 1, wherein
the first first-polysilicon-layer and the first second-polysilicon-layer are provided on the first second-semiconductor-layer, and the second first-polysilicon-layer and the second second-polysilicon-layer are provided on the second second-semiconductor-layer.

4. The semiconductor device according to claim 1, wherein
the first first-polysilicon-layer, the first second-polysilicon-layer, the second first-polysilicon-layer, and the second second-polysilicon-layer are provided in the first semiconductor layer.

5. The semiconductor device according to claim 1, further comprising:
in the first temperature sensing region:
a first cathode electrode pad electrically connected to the first cathode electrode, and
a first anode electrode pad electrically connected to the first anode electrode; and
in the second temperature sensing region:
a second cathode electrode pad electrically connected to the second cathode electrode, and
a second anode electrode pad electrically connected to the second anode electrode.

6. The semiconductor device according to claim 5, wherein
the first first-electrodes and the first cathode electrode are electrically connected to one another.

7. The semiconductor device according to claim 6, wherein
the first first-electrodes and the first cathode electrode are electrically connected to the second cathode electrode.

8. The semiconductor device according to claim 1, further comprising:
in the first temperature sensing region:
a first cathode electrode pad electrically connected to the first cathode electrode, and
a first anode electrode pad electrically connected to the first anode electrode, wherein
the second cathode electrode is electrically connected to the first cathode electrode pad, and
the second anode electrode is electrically connected to the first anode electrode pad.

9. The semiconductor device according to claim 1, further comprising,
in the first MOS structure region, a plurality of first trenches penetrating the first first-semiconductor regions and the first second-semiconductor-layer and reaching the first semiconductor layer, the first gate electrodes being provided in the first trenches via the first gate insulating films, respectively; and
in the second MOS structure region, a plurality of second trenches penetrating the second first-semiconductor-regions and the second second-semiconductor-layer and reaching the first semiconductor layer, the second gate electrodes being provided in the second trenches via the second gate insulating films, respectively.

10. The semiconductor device according to claim 1, wherein each of the semiconductor substrate, the first semiconductor layer, and the second electrode is formed in all of the first MOS structure region, the second MOS structure region, the first temperature sensing region and the second temperature sensing region.

11. The semiconductor device according to claim 10, wherein the plurality of first first-semiconductor-regions, the plurality of first gate insulating films, the plurality of first gate electrodes, the plurality of first first-electrodes, the first second-semiconductor-layer, and a part of each of the semiconductor substrate, the first semiconductor layer and the second electrode that is in the first MOS structure region, form a first MOS structure.

12. The semiconductor device according to claim 10, wherein the plurality of second first-semiconductor-regions, the plurality of second gate insulating films, the plurality of second gate electrodes, the plurality of second first-electrodes, the second second-semiconductor-layer, and a part of each of the semiconductor substrate, the first semiconductor layer and the second electrode that is in the second MOS structure region, form a second MOS structure.

* * * * *